(12) United States Patent
Tateno et al.

(10) Patent No.: US 9,816,182 B2
(45) Date of Patent: Nov. 14, 2017

(54) SUBSTRATE PROCESSING APPARATUS, METHOD FOR MANUFACTURING SEMICONDUCTOR DEVICE, AND RECORDING MEDIUM

(71) Applicant: HITACHI KOKUSAI ELECTRIC INC., Tokyo (JP)

(72) Inventors: Hideto Tateno, Toyama (JP); Yuichi Wada, Toyama (JP); Hiroshi Ashihara, Toyama (JP); Keishin Yamazaki, Toyama (JP); Takurou Ushida, Toyama (JP); Iwao Nakamura, Toyama (JP); Manabu Izumi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/608,937

(22) Filed: Jan. 29, 2015

(65) Prior Publication Data

US 2015/0140835 A1   May 21, 2015

Related U.S. Application Data

(63) Continuation of application No. PCT/JP2013/070341, filed on Jul. 26, 2013.

(30) Foreign Application Priority Data

Jul. 30, 2012 (JP) ................................. 2012-168390

(51) Int. Cl.
C23C 16/40 (2006.01)
H01L 21/67 (2006.01)
(Continued)

(52) U.S. Cl.
CPC ...... *C23C 16/402* (2013.01); *C23C 16/45561* (2013.01); *C23C 16/46* (2013.01);
(Continued)

(58) Field of Classification Search
CPC . C23C 16/402; C23C 16/45561; C23C 16/46; C23C 16/52; H01L 21/02164;
(Continued)

(56) References Cited

U.S. PATENT DOCUMENTS 4,062,318 A * 12/1977 Ban ................... C23C 16/45506
                                                                 118/500
4,401,689 A *  8/1983 Ban ....................... C23C 16/455
                                                                 219/405
(Continued)

FOREIGN PATENT DOCUMENTS

JP      02-086123 A      3/1990
JP      02086123 A *     3/1990
(Continued)

OTHER PUBLICATIONS

Japanese Notification of Reasons for Refusal, JP Application No. 2015-154389, Apr. 28, 2016, 4 pages (English translation provided).
(Continued)

*Primary Examiner* — Sophia Nguyen
(74) *Attorney, Agent, or Firm* — Vople and Koenig, P.C.

(57) ABSTRACT

A substrate processing apparatus is disclosed. The substrate processing apparatus includes a process chamber configured to accommodate a substrate; a gas supply unit configured to supply a process gas into the process chamber; a lid member configured to block an end portion opening of the process chamber; an end portion heating unit installed around a side wall of an end portion of the process chamber; and a thermal conductor installed on a surface of the lid member in an inner side of the process chamber, and configured to be heated by the end portion heating unit.

10 Claims, 16 Drawing Sheets

(51) Int. Cl.
*C23C 16/455* (2006.01)
*C23C 16/46* (2006.01)
*C23C 16/52* (2006.01)
*H01L 21/02* (2006.01)

(52) U.S. Cl.
CPC ........ *C23C 16/52* (2013.01); *H01L 21/02164* (2013.01); *H01L 21/02222* (2013.01); *H01L 21/02238* (2013.01); *H01L 21/02282* (2013.01); *H01L 21/02326* (2013.01); *H01L 21/02337* (2013.01); *H01L 21/67017* (2013.01); *H01L 21/67109* (2013.01); *H01L 21/67115* (2013.01); *H01L 21/67248* (2013.01)

(58) Field of Classification Search
CPC ......... H01L 21/02222; H01L 21/02238; H01L 21/02282; H01L 21/02326; H01L 21/02337; H01L 21/6701; H01L 21/67017; H01L 21/67109; H01L 21/67115; H01L 21/67248
See application file for complete search history.

(56) References Cited

U.S. PATENT DOCUMENTS

| | | | | |
|---|---|---|---|---|
| 4,745,088 A * | 5/1988 | Inoue | C23C 16/4584 | 117/101 |
| 4,981,103 A * | 1/1991 | Sekiguchi | C23C 16/20 | 118/724 |
| 5,318,633 A * | 6/1994 | Yamamoto | C23C 16/4404 | 118/50 |
| 5,324,920 A * | 6/1994 | Nakao | C30B 25/10 | 219/385 |
| 5,329,095 A * | 7/1994 | Okase | C23C 16/46 | 118/724 |
| 5,387,803 A * | 2/1995 | Kurtz | H01L 31/0232 | 257/3 |
| 5,482,558 A * | 1/1996 | Watanabe | C30B 31/14 | 118/500 |
| 5,785,762 A * | 7/1998 | Masuda | H01L 21/67103 | 118/666 |
| 6,005,225 A * | 12/1999 | Kowalski | H01L 21/67098 | 118/50.1 |
| 6,239,044 B1 * | 5/2001 | Kashiwagi | C23C 8/02 | 257/E21.279 |
| 6,255,231 B1 * | 7/2001 | Chen | C23C 8/16 | 438/773 |
| 6,352,593 B1 * | 3/2002 | Brors | C23C 16/44 | 118/641 |
| 6,444,940 B1 * | 9/2002 | Saito | C23C 16/46 | 118/724 |
| 6,475,284 B1 * | 11/2002 | Moore | C23C 16/45502 | 118/715 |
| 6,488,775 B2 * | 12/2002 | Shimizu | C23C 16/455 | 118/715 |
| 6,727,474 B2 * | 4/2004 | Gat | H01L 21/67115 | 118/724 |
| 7,129,186 B2 * | 10/2006 | Hasebe | H01L 21/02238 | 257/E21.285 |
| 7,211,295 B2 * | 5/2007 | Takahashi | H01L 21/0214 | 257/E21.268 |
| 7,304,003 B2 * | 12/2007 | Suzuki | C23C 8/12 | 257/E21.282 |
| 7,419,550 B2 * | 9/2008 | Suzuki | H01L 21/02238 | 118/715 |
| 7,605,095 B2 * | 10/2009 | Ikeuchi | C23C 8/12 | 118/715 |
| 7,700,156 B2 * | 4/2010 | Aoki | H01L 21/02238 | 427/248.1 |
| 7,729,402 B2 * | 6/2010 | Nishiyama | H01S 5/02248 | 372/50.1 |
| 8,068,524 B1 * | 11/2011 | Patel | B82Y 20/00 | 372/34 |
| 8,895,356 B2 * | 11/2014 | Maeng | C23C 16/45502 | 118/728 |
| 2001/0018894 A1 * | 9/2001 | Chang | C23C 16/4557 | 118/724 |
| 2002/0020194 A1 * | 2/2002 | Makikawa | C23C 8/10 | 65/379 |
| 2002/0127873 A1 * | 9/2002 | Sato | C01B 13/00 | 438/770 |
| 2003/0049372 A1 * | 3/2003 | Cook | C23C 16/24 | 427/248.1 |
| 2003/0193642 A1 * | 10/2003 | Tominaga | G02F 1/133382 | 349/196 |
| 2005/0121145 A1 * | 6/2005 | Du Bois | C23C 16/45578 | 156/345.33 |
| 2005/0209088 A1 * | 9/2005 | Tani | C04B 35/573 | 501/80 |
| 2007/0199645 A1 * | 8/2007 | Yanai | G02B 27/1046 | 156/99 |
| 2007/0243317 A1 * | 10/2007 | Du Bois | C23C 16/4583 | 427/98.9 |
| 2008/0093023 A1 * | 4/2008 | Tomita | C23C 16/4405 | 156/345.26 |
| 2009/0016854 A1 * | 1/2009 | Morohashi | H01L 21/67109 | 414/161 |
| 2009/0041650 A1 * | 2/2009 | Watanabe | C23C 16/4405 | 423/335 |
| 2009/0044746 A1 * | 2/2009 | Okamura | H01L 21/67248 | 118/58 |
| 2009/0111285 A1 * | 4/2009 | Yamazaki | H01L 21/67109 | 438/795 |
| 2009/0203229 A1 * | 8/2009 | Ishiguro | H01L 21/324 | 438/795 |
| 2009/0311873 A1 * | 12/2009 | Wang | H01L 21/67109 | 438/758 |
| 2010/0112115 A1 * | 5/2010 | Yoshioka | C03B 19/095 | 425/175 |
| 2010/0144161 A1 * | 6/2010 | Nakamura | C30B 29/06 | 438/767 |
| 2010/0210118 A1 * | 8/2010 | Mizuno | H01L 21/02164 | 438/770 |
| 2010/0212593 A1 | 8/2010 | Takebayashi et al. | | |
| 2011/0065288 A1 * | 3/2011 | Harada | F27B 17/0025 | 438/791 |
| 2011/0127461 A1 * | 6/2011 | Fukuoka | C09K 5/14 | 252/74 |
| 2011/0207339 A1 * | 8/2011 | Yamazaki | H01L 21/67109 | 438/795 |
| 2011/0262120 A1 * | 10/2011 | Uchida | F24H 1/101 | 392/466 |
| 2011/0267801 A1 * | 11/2011 | Tong | F21V 9/16 | 362/84 |
| 2012/0057327 A1 * | 3/2012 | Le | F21V 3/02 | 362/84 |
| 2012/0067869 A1 * | 3/2012 | Shirako | C23C 16/44 | 219/618 |
| 2013/0017328 A1 | 1/2013 | Miyoshi et al. | | |
| 2013/0017503 A1 * | 1/2013 | De Ridder | H01L 21/67109 | 432/18 |
| 2013/0252434 A1 * | 9/2013 | Yuasa | H01L 21/02104 | 438/758 |
| 2013/0272686 A1 * | 10/2013 | Okada | H01L 21/67103 | 392/418 |
| 2014/0256160 A1 * | 9/2014 | Wada | H01L 21/02238 | 438/786 |
| 2014/0327024 A1 * | 11/2014 | Ishihara | H01L 24/97 | 257/98 |
| 2015/0132972 A1 * | 5/2015 | Wada | C23C 16/4401 | 438/778 |
| 2015/0140835 A1 * | 5/2015 | Tateno | C23C 16/52 | 438/773 |
| 2015/0273571 A1 * | 10/2015 | Oguma | B22C 1/00 | 164/517 |
| 2015/0364667 A1 * | 12/2015 | Jarmon | H01L 35/30 | 136/208 |
| 2016/0013053 A1 * | 1/2016 | Ashihara | H01L 21/02164 | 438/778 |

(56) References Cited

U.S. PATENT DOCUMENTS

| | | | |
|---|---|---|---|
| 2016/0031754 A1* | 2/2016 | Koketsu | C03C 17/04 348/374 |
| 2016/0053155 A1* | 2/2016 | Lee | C09K 5/14 428/336 |
| 2016/0076149 A1* | 3/2016 | Yamazaki | C23C 16/4401 438/758 |
| 2016/0118199 A1* | 4/2016 | Okuno | H01G 11/34 320/167 |
| 2016/0126581 A1* | 5/2016 | Timofeeva | H01M 8/188 429/81 |
| 2016/0141866 A1* | 5/2016 | Bromberg | F28D 20/0034 505/230 |
| 2016/0195344 A1* | 7/2016 | Tomita | H01L 23/3733 165/277 |
| 2016/0254545 A1* | 9/2016 | Sugita | H01M 4/62 |

FOREIGN PATENT DOCUMENTS

| | | | | |
|---|---|---|---|---|
| JP | 05-259101 | A | | 10/1993 |
| JP | 08-064532 | A | | 3/1996 |
| JP | 08064532 | A | * | 3/1996 |
| JP | 08-088192 | A | | 4/1996 |
| JP | 08088192 | A | * | 4/1996 |
| JP | 08-124869 | A | | 5/1996 |
| JP | 08-162422 | A | | 6/1996 |
| JP | H09-148315 | A | | 6/1997 |
| JP | H11-354516 | A | | 12/1999 |
| JP | 2003-068665 | A | | 3/2003 |
| JP | 2009-132961 | A | | 6/2009 |
| JP | 2010-199160 | A | | 9/2010 |
| JP | 2010-219500 | A | | 9/2010 |
| JP | 2011-086908 | A | | 4/2011 |
| JP | 2011-216862 | A | | 11/2011 |

OTHER PUBLICATIONS

Japanese Notification of Reasons for Refusal, JP Application No. 10-2015-7002480, Sep. 27, 2016, 7 pages (English translation provided).

Chinese Second Office Action, CN Application No. 2013-80040677.1, Apr. 5, 2017, 16 pages (English translation provided).

* cited by examiner

SUBSTRATE PROCESSING APPARATUS, METHOD FOR MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2012-168390, filed on Jul. 30, 2012, the entire contents of which are incorporated herein by reference.

TECHNICAL FIELD

The present disclosure relates to a technique for processing a substrate with a gas.

BACKGROUND

With decrease in size of large scale integrated circuits (LSIs), processing techniques for controlling leakage current interference between transistor elements are increasingly gaining technical difficulties. LSI element isolation is achieved by a method of forming gaps such as grooves or holes in a silicon (Si) substrate between elements to be isolated, and depositing insulating material in the gaps. The insulating material may often be an oxide film such as a silicon oxide film. The silicon oxide film is formed by oxidation of the Si substrate, CVD (Chemical Vapor Deposition), or SOD (Spin On Dielectric).

With recent miniaturization, to fill micro structures, particularly, a gap structure, which is deep in a vertical direction or narrow in a horizontal direction, with oxide, a filling method using a CVD method has reached a technology limit. In response to this background, a filling method using oxide having fluidity, i.e., SOD, tends to be increasingly employed. For SOD, a coating insulating material containing an inorganic or organic component called SOG (Spin On Glass) is being used. Although this material has been employed for LSI manufacturing processes before appearance of CVD oxide films, since processing technology has non-fine feature size in a range from 0.35 μm to 1 μm or so, a modification method after coating was allowed by performing heat treatment of 400 degrees C. in a nitrogen atmosphere.

On the other hand, there is an increasing need to reduce a thermal load of transistors. The reason for reducing the thermal load includes prevention of excessive diffusion of impurities, such as boron, arsenic, phosphorus, and so on, which are injected for operation of transistors, prevention of aggregation of metal silicide for electrodes, prevention of performance variation of work function metal material for gates, secure of writing/reading repetition lifetime of memory devices, etc.

However, since the minimum feature size of a semiconductor device represented by recent LSI, DRAM (Dynamic Random Access Memory), or flash memories is smaller than 50 μm width, it is difficult to achieve miniaturization and improvement of manufacturing throughput while maintaining quality, and make a process temperature low.

SUMMARY

The present disclosure provides some embodiments of a technique, which are capable of improving manufacturing quality and throughput of semiconductor devices.

According to one embodiment of the present disclosure, there is provided a substrate processing apparatus including a process chamber configured to accommodate a substrate; a gas supply unit configured to supply a process gas into the process chamber; a lid member configured to block an end portion opening of the process chamber; an end portion heating unit installed around a side wall of an end portion of the process chamber; and a thermal conductor installed on a surface of the lid member in an inner side of the process chamber, and configured to be heated by the end portion heating unit.

DETAILED DESCRIPTION

First Embodiment

Figure 1:
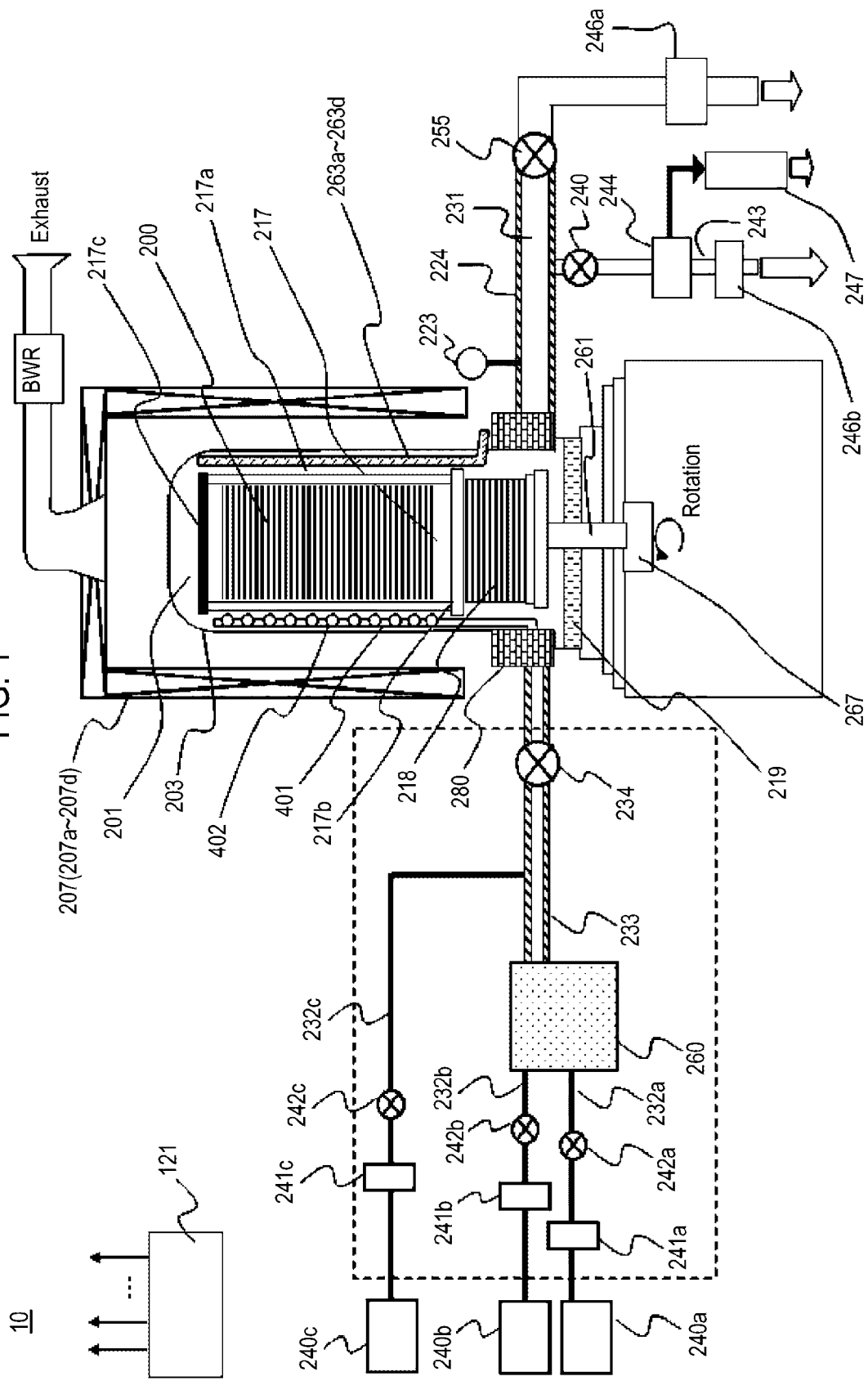
FIG. 1 schematically illustrates a configuration of a substrate processing apparatus according to a first embodiment.
Figure 2:
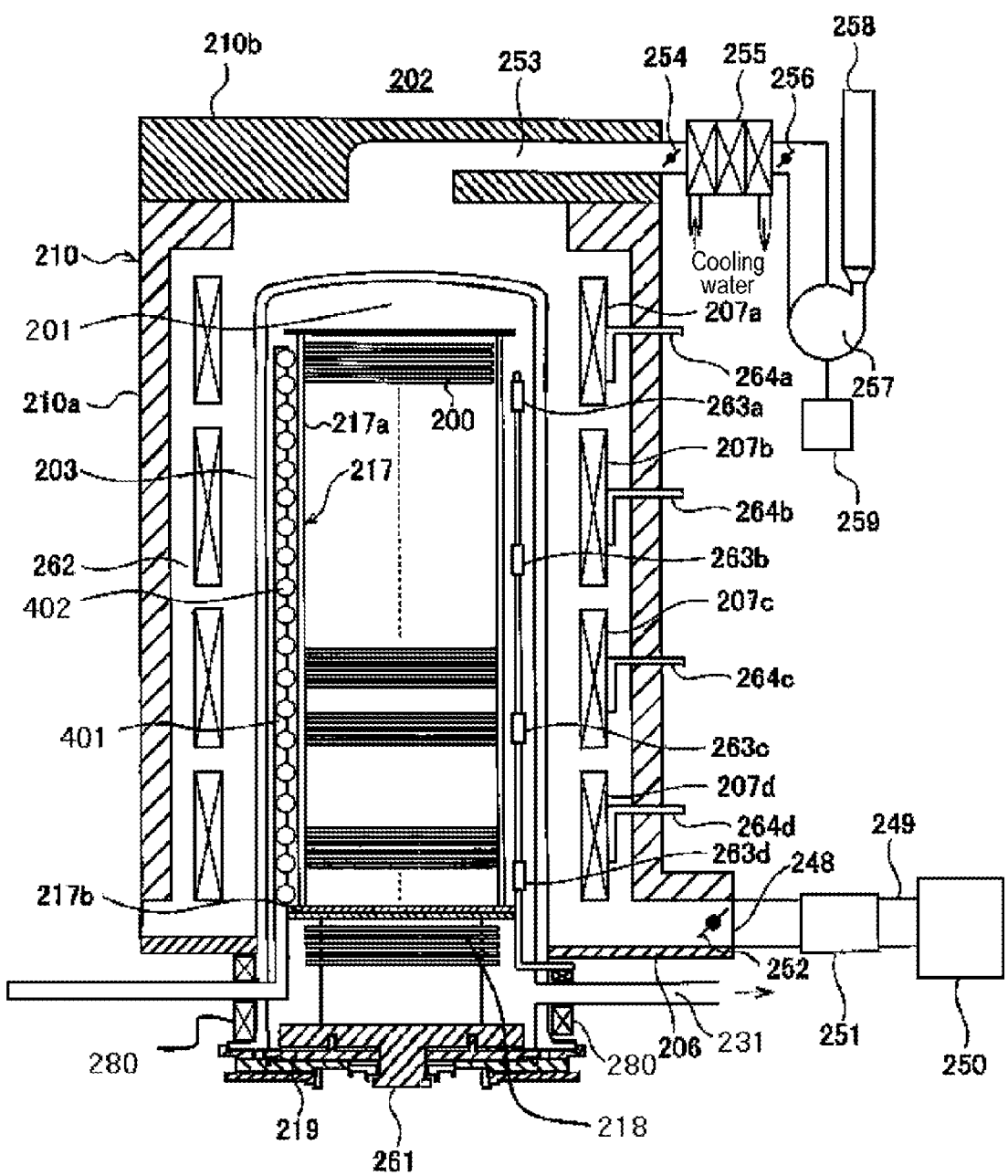
FIG. 2 schematically illustrates a longitudinal sectional view of the substrate processing apparatus according to the first embodiment.

Hereinafter, a first embodiment is described.
(1) Configuration of Substrate Processing Apparatus First, a configuration of a substrate processing apparatus according to the present embodiment is described with reference to FIGS. 1 and 2. FIG. 1 schematically illustrates the configuration of the substrate processing apparatus according to the present embodiment, in which a portion of a processing furnace 202 is shown in a longitudinal sectional view. FIG. 2 schematically illustrates a longitudinal sectional view of the processing furnace 202 in the substrate processing apparatus according to the present embodiment. For example, a procedure for manufacturing a semiconductor device is performed in the substrate processing apparatus.

(Processing Container)

As depicted in FIG. 1, the processing furnace 202 includes a reaction tube 203 that serves as a processing container. The reaction tube 203 is made of heat resistant material such as quartz ($SiO_2$) or silicon carbide (SiC), and has a cylindrical shape with its upper and lower ends opened. A process chamber 201 is formed in a hollow cylindrical portion of the reaction tube 203, and is configured to accommodate a plurality of wafers 200 as substrates in such a state that the wafers 200 are horizontally stacked in multiple stages along a vertical direction by a boat 217 which will be described later.

A seal cap 219, which serves as a furnace port cover configured to hermetically seal (or block) a lower end opening (i.e., furnace opening) of the reaction tube 203, is installed under the reaction tube 203. The seal cap 219 is configured to contact a lower end portion of the reaction tube 203 from its bottom portion in a vertical direction. The seal cap 219 has a disc shape. The process chamber 201 serving as a substrate processing space includes the reaction tube 203 and the seal cap 219.

(Substrate Support)

The boat 217, which is used as a substrate support, is configured to support the plurality of wafers 200 in multiple stages. The boat 217 has a plurality of posts 217a for supporting the plurality of wafers 200. In this embodiment, the number of the posts 217a is three. The plurality of posts 217a is installed between a base plate 217b and a ceiling plate 217c. The plurality of wafers 200 is horizontally supported by the posts 217a in multiple stages along a tube-axial direction, with the centers of the wafers 200 concentrically aligned. The ceiling plate 217c is formed to be larger than a maximum outer diameter of the wafers 200 supported in the boat 217.

The posts 217a, the base plate 217b, and the ceiling plate 217c are made of nonmetallic material having high thermal conductivity, such as silicon carbide (SiC), aluminum oxide (AlO), aluminum nitride (AlN), silicon nitride (SiN), or zirconium oxide (ZrO). In particular, nonmetallic material having thermal conductivity of 10 W/mK or greater may be preferable. If the thermal conductivity is not a concern, the nonmetallic material may be quartz (SiO) or the like. If contamination of the wafers 200 by metal is not problematic, the posts 217a and the ceiling plate 217c may be made of metal material such as stainless steel. If the posts 217a and the ceiling plate 217c are made of metal, a film of ceramics or Teflon® may be coated on the metal.

A heat insulator 218 made of heat resistant material such as quartz or silicon carbide is installed under the boat 217 and is configured to prevent heat from being transferred from a first heating part 207 to the seal cap 219. The heat insulator 218 functions not only as a heat insulating member, but also as a holder for holding the boat 217. In addition, the heat insulator 218 is not limited to a plurality of disc-like heat insulating plates, which are horizontally stacked in multiple stages, as shown, but may be a cylindrical quartz cap or the like. The heat insulator 218 may be also considered as one of components of the boat 217.

(Elevating Unit)

A boat elevator as an elevating unit for elevating the boat 217 to transfer into or out of the reaction tube 203 is installed below the reaction tube 203. The seal cap 219 for sealing the furnace opening when the boat 217 is ascended by the boat elevator is installed in the boat elevator.

A boat rotation mechanism 267 for rotating the boat 217 is installed at a side of the seal cap 219 opposite to the process chamber 201. A rotary shaft 261 of the boat rotation mechanism 267 is connected to the boat 217 via the seal cap 219 and is configured to rotate the wafers by rotating the boat 217.

(First Heating Part)

The first heating part 207 for heating the wafers 200 in the reaction tube 203 is installed outside the reaction tube 203 and has a concentric shape to surround a side wall of the reaction tube 203. The first heating part 207 is supported by a heater base 206. As illustrated in FIG. 2, the first heating part 207 includes first to fourth heater units 207a to 207d. The first to fourth heater units 207a to 207d are installed along a stacked direction of the wafers 200 in the reaction tube 203.

As temperature detectors for detecting a temperature of the wafers 200 or an ambient temperature, first to fourth temperature sensors 263a to 263d such as thermocouples are installed, respectively, to the first to fourth heater units 207a to 207d, between the reaction tube 203 and the boat 217. Also, sets of wafers 200 in the plurality of wafers 200 are heated by the heater units 207a to 207d, respectively, and the first to fourth temperature sensors 263a to 263d may be installed to detect temperatures of wafers 200, respectively, which are located in the middle of the sets of wafers 200.

A controller 121, which will be described later, is electrically connected to the first heating part 207 and the first to fourth temperature sensors 263a to 263d. To control the temperature of the wafers 200 in the reaction tube 203 to be a predetermined temperature, the controller 121 is configured to perform individually setting and adjusting a temperature of each of the first to fourth heater units 207a to 207d, by controlling the supply of electric power to the first to fourth heater units 207a to 207d at predetermined timings, based on temperature information that is detected by the first to fourth temperature sensors 263a to 263d.

(Gas Supply Unit)

As illustrated in FIG. 1, a gas supply pipe 233 serving as a gas supply unit for supplying a vaporized precursor as a process gas into the reaction tube 203 is installed outside the reaction tube 203. The vaporized precursor may have a boiling point in a range from 50 degrees C. to 200 degrees C. In this embodiment, the vaporized precursor may be water vapor ($H_2O$).

The gas supply pipe 233 is connected to a gas supply nozzle 401 that is installed in the reaction tube 203. The gas supply nozzle 401 is installed along the stacked direction of the wafers 200 from a bottom portion to a top portion of the reaction tube 203. The gas supply nozzle 401 is formed to have a plurality of gas supply holes 402 through which the water vapor can evenly be supplied into the reaction tube 203. The gas supply pipe 233 is connected to a water vapor generator 260. Water vapor generated in the water vapor generator 260 rises from the bottom portion of the reaction tube 203 into the gas supply nozzle 401, and is supplied into the reaction tube 203 through the plurality of gas supply holes 402.

The water vapor generator 260 is connected with a hydrogen gas supply pipe 232a and an oxygen gas supply pipe 232b. A hydrogen gas supply source 240a, a mass flow controller (i.e., MFC or a flow rate controller) 241a, and an opening/closing valve 242a are sequentially installed in the hydrogen gas supply pipe 232a from an upstream side. An oxygen gas supply source 240b, an MFC 241b, and an opening/closing valve 242b are sequentially installed in the oxygen gas supply pipe 232b from an upstream side. The water vapor generator 260 generates the water vapor by using hydrogen gas supplied from the hydrogen gas supply source 240a and oxygen gas supplied from the oxygen gas supply source 240b.

An inert gas supply pipe 232c is connected to a portion of the gas supply pipe 233. An inert gas supply source 240c, an MFC 241c, and an opening/closing valve 242c are sequentially installed in the inert gas supply pipe 232c from an upstream side. A gas flow rate control unit 283 is electrically connected to the MFCs 241a, 241b, and 241c and the valves 242a, 242b, and 242c and is configured to control flow rates of the supplied gases at desired timings such that the flow rates reach desired values.

The gas supply unit includes the gas supply nozzle 401, the gas supply holes 402, the gas supply pipe 233, the water vapor generator 260, the hydrogen gas supply pipe 232a, the oxygen gas supply pipe 232b, the MFC 241a, the MFC 241b, the opening/closing valve 242a, and the opening/closing valve 242b. The gas supply unit may further include the hydrogen gas supply source 240a, the oxygen gas supply source 240b, the inert gas supply pipe 232c, the opening/closing valve 242c, the MFC 241c, and the inert gas supply source 240c.

(Exhaust Unit)

One end of a gas exhaust pipe 231 for exhausting gas in the process chamber 201 is connected to a lower portion of the reaction tube 203. The other end of the gas exhaust pipe 231 is connected to a vacuum pump 246a (i.e., exhauster) via an auto pressure controller (APC) valve 255. An interior of the process chamber 201 is exhausted by a negative pressure generated in the vacuum pump 246a. The APC valve 255 is an opening/closing valve capable of performing or stopping exhaust of the process chamber 201 by opening or closing the valve. This valve also serves as a pressure adjusting valve that is capable of adjusting a pressure by adjusting a degree of opening the valve. A pressure sensor 223 serving as a pressure detector is installed at an upstream side of the APC valve 255. In this manner, the exhaust unit is configured to vacuum-exhaust the interior of the process chamber 201 such that an internal pressure of the process chamber 201 reaches a predetermined pressure (i.e., degree of vacuum). A pressure control unit is electrically connected to the process chamber 201 and the pressure sensor 223 by the APC valve 255 and is configured to control the internal pressure of the process chamber 201 based on a pressure detected by the pressure sensor 223 such that the internal pressure reaches a desired pressure by using the APC valve 255.

The exhaust unit includes the gas exhaust pipe 231, the APC valve 255, the pressure sensor 223, etc. The exhaust unit may further include the vacuum pump 246.

(Second Heating Part)

In the course of research and development, the inventors of the present disclosure have found a problem that couldn't happen in conventional processes in a range from about 300 degrees C. to 400 degrees C., or higher. The problem was that in the process in a range from room temperature to 300 degrees C. or so, a vaporization precursor as a process gas in the reaction tube 203 is cooled to a temperature lower than a boiling point of the vaporization precursor, and thus, is liquefied. It has proved through research that such liquefaction is caused much in a lower portion of the boat 217 and around the heat insulator 218 and the gas exhaust pipe 231. It has also been found that this liquefaction occurs below the heat insulator 218 and at positions apart from the wafers 200.

In addition, the inventors have found problems that alien substances are produced on the wafers 200, and when the plurality of wafers 200 is processed, film thickness differences occur among the respective wafers 200.

Accordingly, the inventors of the present disclosure have tried to resolve the above problems by installing a liquefaction prevention heater 280 as a second heating part (i.e., thermal conductor heating part) as shown in FIGS. 1 and 2.

Herein, the term "liquefaction" is intended to include phenomena such as dew condensation and coagulation.

Figure 4:
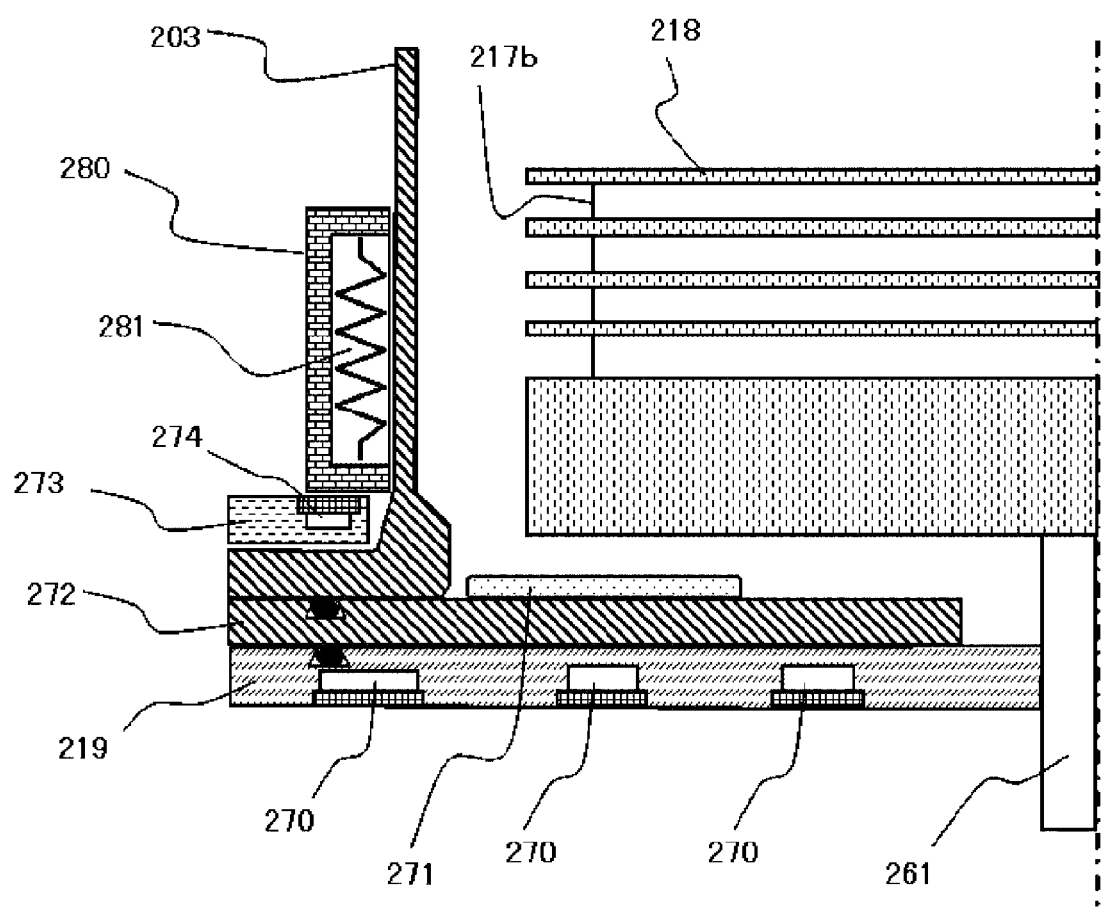
FIG. 4 schematically illustrates a configuration in the vicinity of a furnace opening according to the first to third embodiments.
Figure 5:
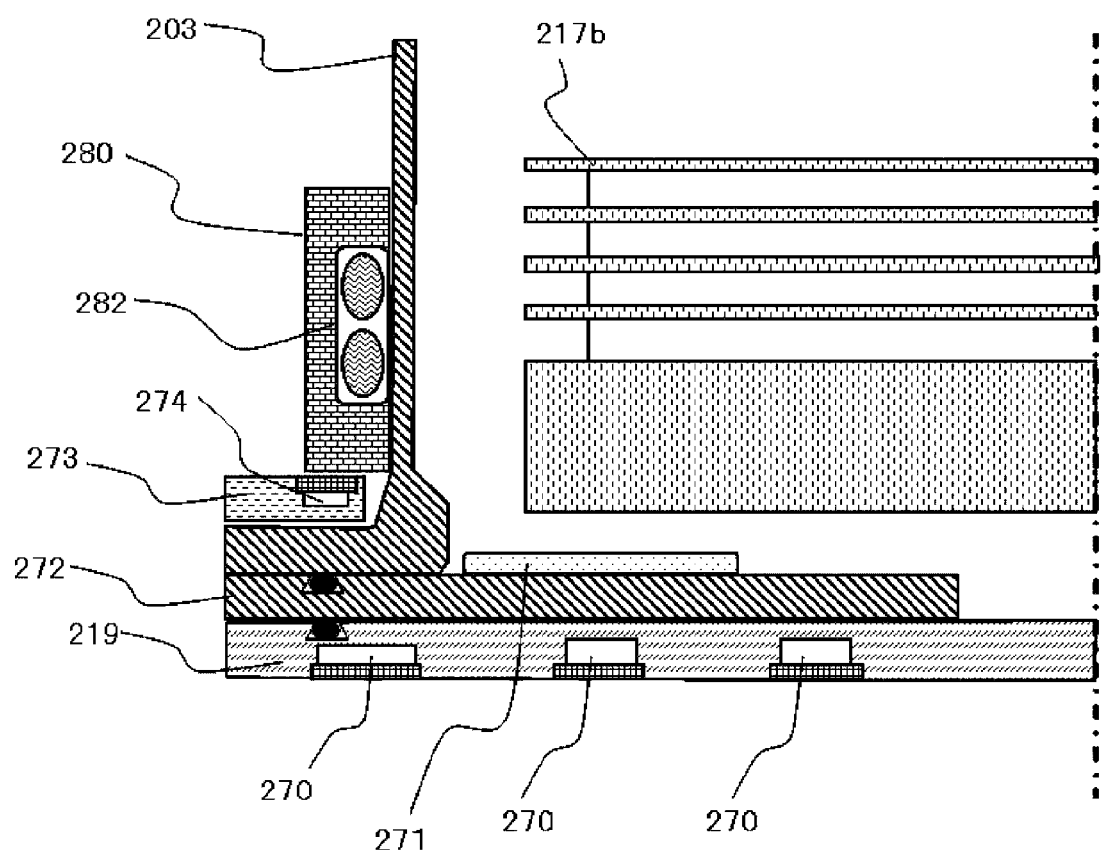
FIG. 5 schematically illustrates another configuration in the vicinity of the furnace opening according to the first to third embodiments.

FIG. 4 illustrates a sectional view of the seal cap 219 and the lower portion (i.e., furnace opening portion) of the reaction tube 203. As depicted in FIG. 4, the liquefaction prevention heater 280 serving as the second heating part is installed in the lower portion of the reaction tube 203, above the seal cap 219 and around a side wall of the reaction tube 203. The second heating part may be installed below the first heating part. The liquefaction prevention heater 280 may be configured with a resistive heater 281 as shown in FIG. 4 or a lamp heater 282, which is a radiative heating part, as shown in FIG. 5. A seal cap protection part 272 for protecting the seal cap 219 from a vaporized precursor is installed on the seal cap 219. The seal cap protection part is made of material which is difficult to react with the vaporized precursor, for example, nonmetallic material such as quartz ($SiO_2$) or the like. An O-ring (i.e., seal member) for maintaining airtightness is installed at the lower end portion of the reaction tube 203, between the seal cap protection part 272 and the seal cap 219. An O-ring protection part 273 having a cooling passage 274 is installed in the lower end portion of the reaction tube 203. Also, a cooling passage 270 is installed in the seal cap 219. The cooling passages 274 and 270 can prevent the O-ring from being deteriorated and the seal cap 219 from being deformed because of heat emitted from the liquefaction prevention heater 280 and emitted from the first to fourth heater units 207a to 207d. In the case where the seal cap and the seal cap protection part 272 are cooled, and thus, dew condensation occurs on surfaces of the seal cap and the seal cap protection part 272, a heat conduction part (i.e., thermal conductor) 271 may be installed on the seal cap protection part 272 to allow the surface of the seal cap protection part 272 to be easily heated, as illustrated in FIGS. 4 and 5. The heat conduction part 271 is made of the same kind of the material as the boat 217, for example, nonmetallic material having high thermal conductivity, such as silicon carbide (SiC), aluminum oxide (AlO), aluminum nitride (AlN), boron nitride (BN), silicon nitride (SiN), or zirconium oxide (ZrO), or carbon material such as graphite or glassy carbon. The thermal conductivity may be 5 W/mK or greater. Since it is likely that the heat conduction part is in contact with the precursor gas, the heat conduction part may be made of material which does not react with the precursor gas. In addition, the heat conduction part 271 may be configured to have a self-heating function by including a conductive member and flowing electric current into the conductive member. Additionally, the heat conduction part 271 may be formed to have a porous structure to increase an evaporation area. The lamp heater 282 may be configured to directly heat the seal cap protection part 272 and the heat conduction part 271 via a transparent member through which light transmits. In this case, the transparent member corresponds to a portion of the reaction tube 203, which is made of, for example, quartz. If it is not intended that the wafers 200 are heated by the lamp heater 282, an opaque member may be used instead of the transparent member or an awning may be further installed. Further, the seal cap protection part 272 may be made of SiC and the heat conduction part 271 may be made of quartz. The above configuration can prevent contamination while the furnace opening portion is heated.

(One Type of Liquefaction Prevention Heater)

Figure 6A:
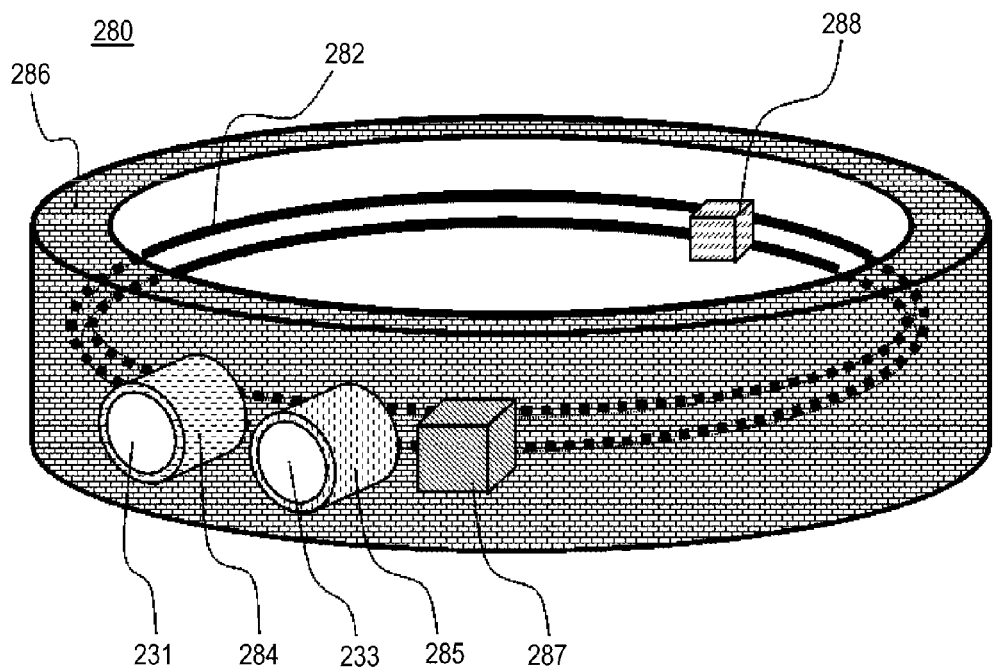
FIG. 6A schematically illustrates another configuration in the vicinity of the furnace opening according to the first to third embodiments, and FIG. 6B schematically illustrates still another configuration in the vicinity of the furnace opening according to the first to third embodiments.

One type of the liquefaction prevention heater 280 is illustrated in FIG. 6A. As shown in FIG. 6A, the lamp heater 282 is installed in the liquefaction prevention heater 280 to surround an entire circumference of the reaction tube 203. A heat insulating member 286 is installed around the lamp heater 282. As the lamp heater 282 is installed to surround the entire circumference of the reaction tube 203, an entire lower portion of the reaction tube 203 can be evenly heated. In addition, the heat insulating member 286 can contribute to improving thermal efficiency of the lamp heater 282, which may decrease power consumption, while reducing thermal effect on other devices and controllers which are out of the reaction tube 203. An example of the heat insulating member 286 may include alumina cloth or the like.

(Another Type of Liquefaction Prevention Heater)

Figure 6B:
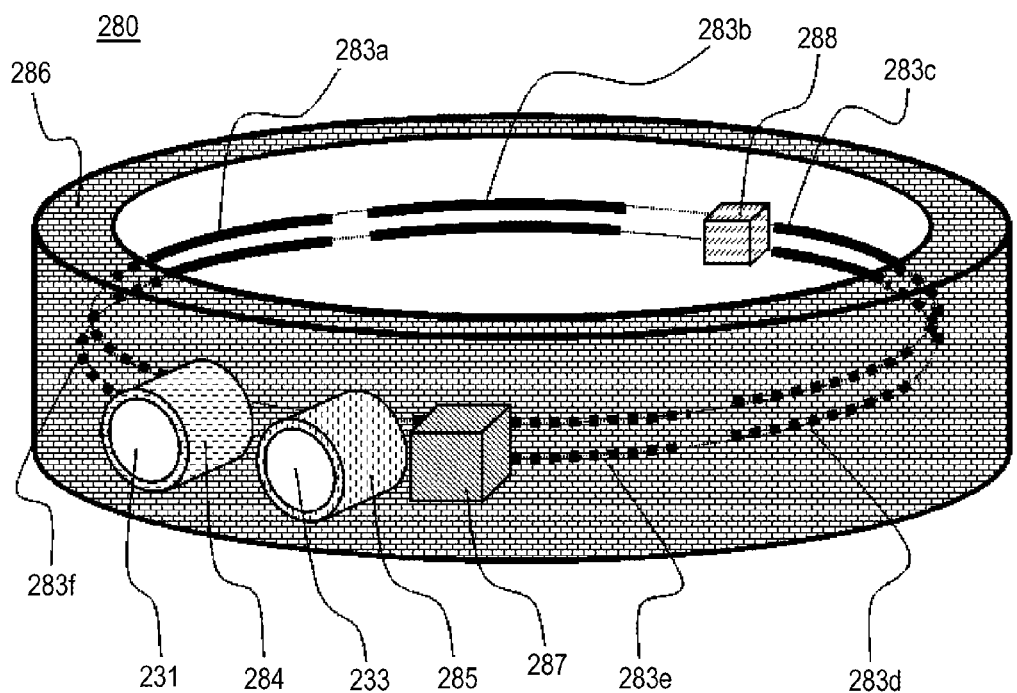

Another type of liquefaction prevention heater 280 is illustrated in FIG. 6B. As shown in FIG. 6B, a plurality of separate lamp heaters 283a, 283b, 283c, 283d, 283e, and 283f is installed in the liquefaction prevention heater 280. By providing the plurality of separate lamp heaters as depicted in FIG. 6B, it is possible to adjust an amount of heat that is supplied to portions that are easy to be heated, and portions that are hard to be heated. This allows desired places to be heated evenly. For example, if the entire circumference is heated with the lamp heater 282, since a shadow is formed in the heat insulator 218 by the posts 217a of the boat 217, it is difficult to heat the entire circumference evenly. If the separated lamp heaters 283a to 283f are installed at positions which do not face the posts 217a, since no shadow is formed in the heat insulator 218, it is possible to heat the entire circumference evenly.

(Lamp Heater)

The inventors of the present disclosure have also conducted intensive research and development for how to increase heating efficiency of a vaporized precursor by the lamp heater 282 and it has been consequently proved that the heating efficiency can be improved by adjusting a wavelength of light emitted from the lamp heater 282.

For example, if the vaporized precursor is hydrogen peroxide water or water containing water molecules ($H_2O$), a lamp capable of emitting light having a wavelength which can be easily absorbed by the water molecules may be used to improve the heating efficiency. The light having the wavelength which can be easily absorbed by the water molecules corresponds to infrared rays having a wavelength in a range from about 0.7 µm to about 250 µm. Any lamp capable of emitting the infrared rays in the above wavelength band may be used to improve the heating efficiency. Specifically, the lamp may emit light in a range from about 1.3 µm to about 200 µm. More specifically, the lamp may emit light in a range from about 2 µm to about 20 µm. Still more specifically, the lamp may emit light in a range from about 2 µm to about 4.5 µm, which corresponds to a medium infrared ray. Examples of the lamp may include a Cantal wire heater with an emission peak wavelength of about 2.2 µm. Additionally, a carbon heater, a SiC heater, a tungsten lamp, a halogen lamp, and the like may be used.

(Position of Liquefaction Prevention Heater)

The liquefaction prevention heater 280 may be installed below a lower end portion of the heat insulator 218, as shown in FIG. 1. The lower portion of the reaction tube 203, a connection portion of the reaction tube 203 and the gas exhaust pipe 231, and a connection portion of the reaction tube 203 and the gas supply pipe 233 are heat-insulated from the first heating part 207 by the heat insulator 218 to be maintained in a low temperature state. Therefore, surrounding environments of the lower portion of the reaction tube 203, the connection portion of the reaction tube 203 and the gas exhaust pipe 231, and the connection portion of the reaction tube 203 and the gas supply pipe 233 have an atmosphere where a process gas supplied into the reaction tube 203 may be liquefied. This liquefaction can be prevented by the liquefaction prevention heater 280 installed below an upper end portion of the heat insulator 218.

(Exhaust Heating Part)

Figure 7:
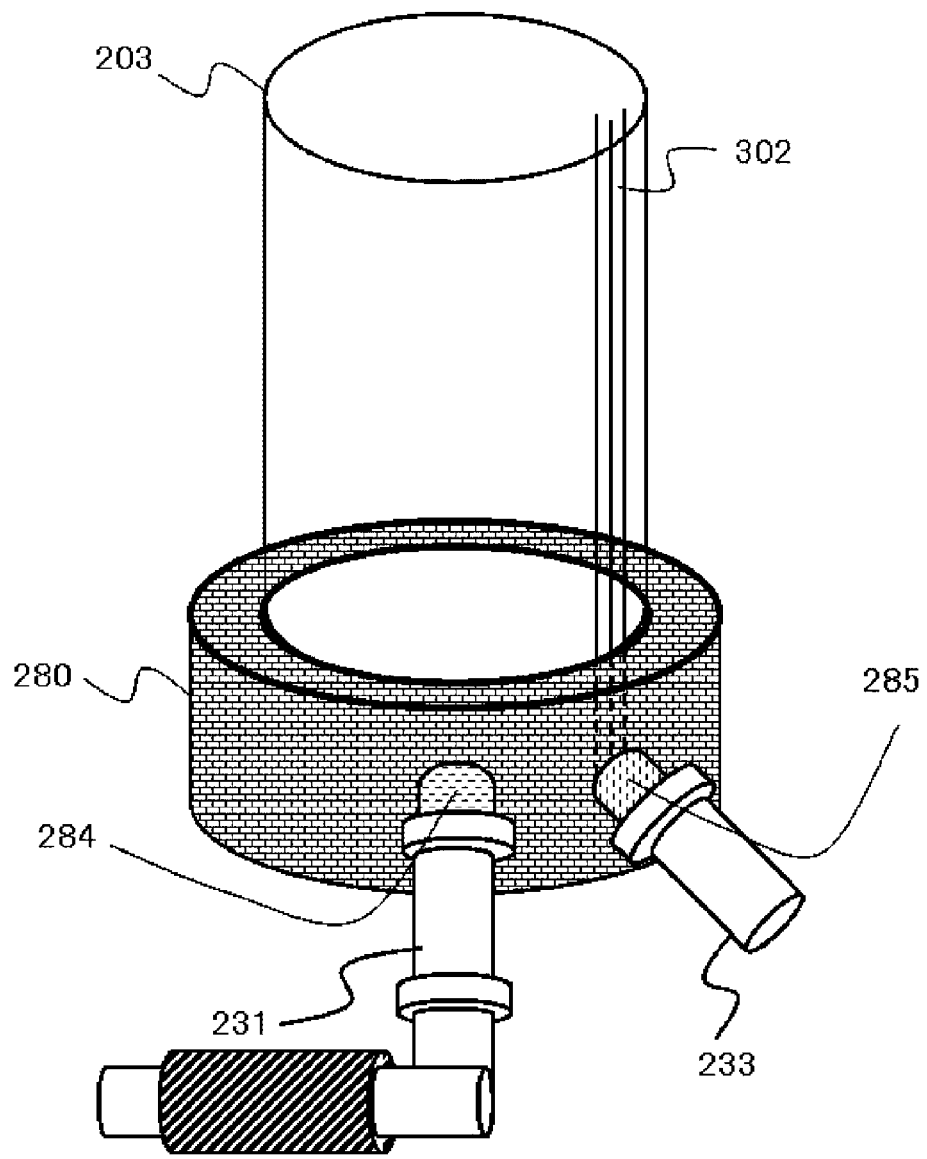
FIG. 7 schematically illustrates an example of positions of a gas supply pipe and a gas exhaust pipe according to the first to third embodiments.

As depicted in FIGS. 6A, 6B, and 7, an exhaust tube heater 284 serving as an exhaust heating part for heating the gas exhaust pipe is installed to the gas exhaust pipe 231. The exhaust tube heater 284 is controlled to a desired temperature, e.g., in a range from 50 degrees C. to 300 degrees C., to prevent dew condensation in the gas exhaust pipe 231.

(Supply Heating Part)

As depicted in FIGS. 6A, 6B, and 7, an inlet tube heater 285 serving as a supply heating part is installed between the gas supply pipe 233 and the reaction tube 203. The inlet tube heater 285 is controlled to a desired temperature, e.g., in a range from 50 degrees C. to 300 degrees C., to prevent dew condensation in the gas supply pipe 233.

(Liquefaction Prevention Control Part)

As depicted in FIGS. 6A and 6B, a liquefaction prevention controller 287 serving as a liquefaction prevention control part for controlling a temperature of the lamp heater 282, the exhaust tube heater 284, and the inlet tube heater 285 to a liquefaction prevention temperature is installed.

A temperature detector 288 for detecting the temperature of the lamp heater 282, the exhaust tube heater 284, and the inlet tube heater 285 is installed in the liquefaction prevention controller 287. An example of the temperature detector 288 may include a sheath type thermocouple. Amounts of electric power supplied to the lamp heater 282, the exhaust tube heater 284, and the inlet tube heater 285 are controlled based on the temperature detected by the temperature detector 288. For example, the electric power is controlled to enter an ON state when the temperature of the lamp heater 282, the exhaust tube heater 284, and the inlet tube heater 285 reaches 100 degrees C. or less, and an OFF state when the temperature reaches 300 degrees C. or more. Instead of the above ON/OFF control, feedback control such as proportional integral differential (PID) control may be performed to hold the heaters 282, 284, and 285 at a desired temperature (e.g., 200 degrees C.). The lamp heater 282 may perform the ON/OFF control at least during the supply of the process gas and may be put in the OFF state when the wafers 200 are not present in the process chamber 201 or when the wafers 200 are subjected to treatment of 300 degrees C. or more.

Although FIGS. 1 and 2 illustrate that the gas supply pipe 233 and the gas exhaust pipe 231 are installed at opposite positions, the pipes may be installed at the same side, as illustrated in FIGS. 6A, 6B, and 7. Since empty spaces in a substrate processing apparatus or empty spaces in a semiconductor device manufacturing plant equipped with a plurality of substrate processing apparatuses are narrow, it is possible to easily perform maintenance of the gas supply pipe 233, the gas exhaust pipe 231, and the liquefaction prevention heater 280 by installing the gas supply pipe 233 and the gas exhaust pipe 231 at the same side as described above.

(Control Part)

Figure 3:
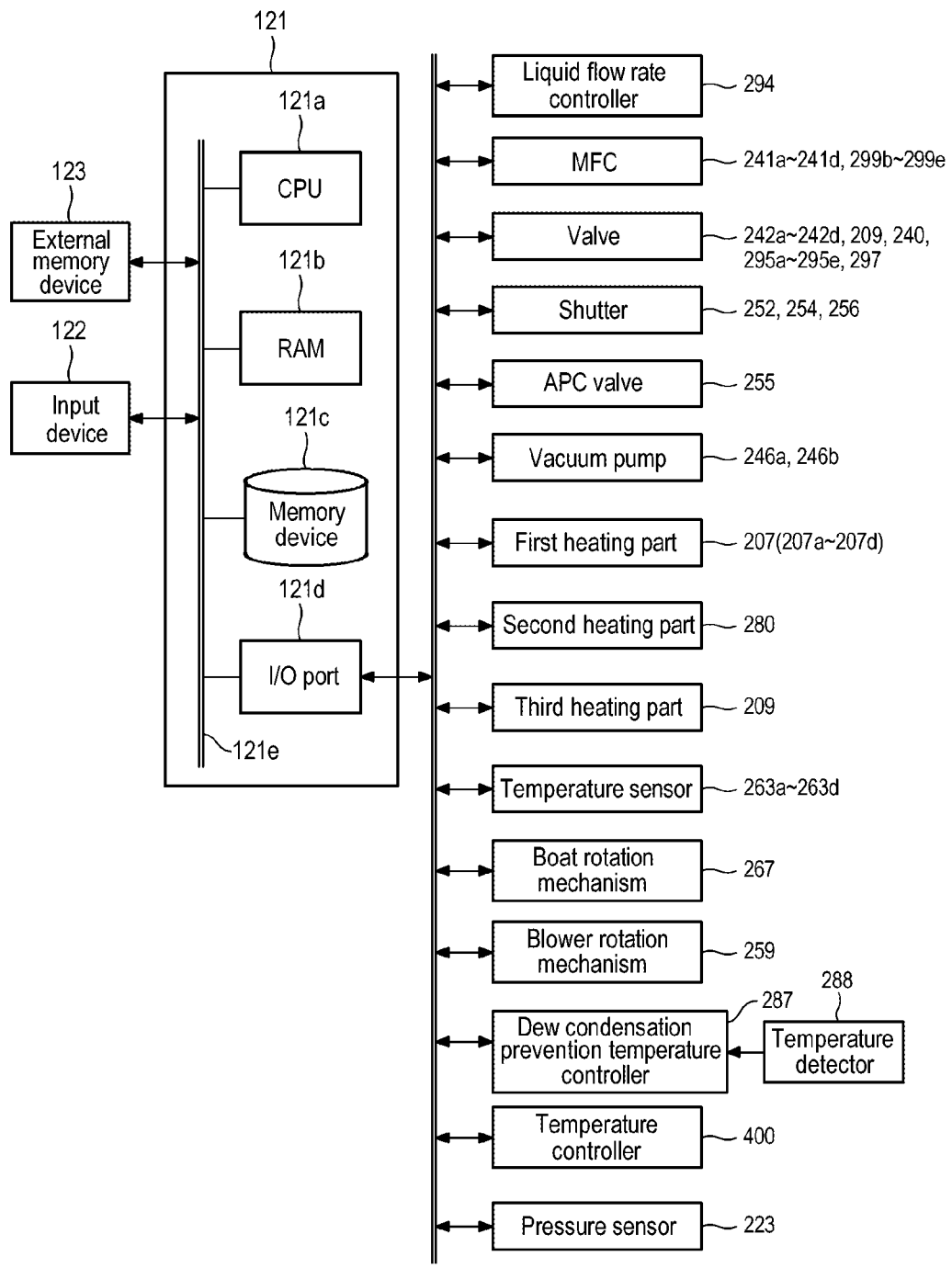
FIG. 3 schematically illustrates a configuration of a controller of the substrate processing apparatus which is appropriately used in the first to third embodiments.

As illustrated in FIG. 3, a controller 121, which is a control unit (or a control part), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122, for example, including a touch panel or the like, is connected to the controller 121.

The memory device 121c is configured with, for example, a flash memory, a hard disc drive (HDD), or the like. A control program for controlling operations of the substrate processing apparatus or a process recipe, in which a sequence or condition for processing a substrate described later is written, is readably stored in the memory device 121c. Also, the process recipe functions as a program for the controller 121 to execute each sequence in the substrate processing process, which will be described later, to obtain a predetermined result. Hereinafter, such a process recipe or control program may be generally referred to as "a program." Also, when the term "program" is used herein, it may indicate a case of including only a process recipe, a case of including only a control program, or a case of including both a process recipe and a control program. In addition, the RAM 121b is configured as a memory area (or a work area) in which a program or data read by the CPU 121a is temporarily stored.

The I/O port 121d is connected to the liquid mass flow controller 294, the mass flow controllers 241a, 241b, 241c, 241d, 299b, 299c, 299d, and 299e, the valves 242a, 242b, 242c, 242d, 234, 240, 295a, 295b, 295c, 295d, 295e, and 297, shutters 252, 254 and 256, the APC valve 255, the first heating part 207 (i.e., 207a, 207b, 207c, and 207d), the second heating part (i.e., liquefaction prevention heater 280), a third heating part 209, a blower rotation mechanism 259, the first to fourth temperature sensors 263a to 263d, the boat rotation mechanism 267, the liquefaction prevention controller 287, the pressure sensor 223, a temperature controller 400, and so on.

The CPU 121a is configured to read and execute the control program from the memory device 121c. The CPU 121a also reads the process recipe from the memory device 121c according to an input of an operation command from the input/output device 122. In addition, the CPU 121a is configured to control the flow rate adjusting operation of liquid precursor by the liquid mass flow controller 294, the flow rate adjusting operation of various gases by the MFCs 241a, 241b, 241c, 241d, 299b, 299c, 299d, and 299e, the opening and closing operation by the valves 242a, 242b, 242c, 242d, 234, 240, 295a, 295b, 295c, 295d, and 295e, the shuttering operation by the shutters 252, 254, and 256, the opening and closing adjusting operation by the APC valve 255, the temperature adjusting operation of the first heating part 207 based on the first to fourth temperature sensors 263a to 263d, the temperature adjusting operation of the third heating part 209 based on the temperature sensors, the starting and stopping of the vacuum pumps 246a and 246b, the rotation speed regulating operation of the blower rotation mechanism 259, the rotation speed regulating operation of the boat rotation mechanism 267, the temperature control of the liquefaction prevention heater 280 (i.e., second heating part) by the liquefaction prevention controller 287, a hydrogen peroxide vapor generator 307 by the temperature controller 400, and the like, according to contents of the read process recipe.

Moreover, the controller 121 is not limited to being configured as a dedicated computer but may be configured as a general-purpose computer. For example, the controller 121 according to one embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, means for supplying a program to a computer is not limited to the case in which the program is supplied through the external memory device 123. For example, the program may be supplied using communication means such as the Internet or a dedicated line, rather than through the external memory device 123. Also, the memory device 121c or the external memory device 123 is configured as a non-transitory computer-readable recording medium. Hereinafter, the means for supplying the program will be simply referred to as "a recording medium." In addition, when the term "recording medium" is used herein, it may include a case of including only the memory device 121c, a case of including only the external memory device 123, or a case of including both the memory device 121c and the external memory device 123.

(2) Substrate Processing Procedure

Figure 8:
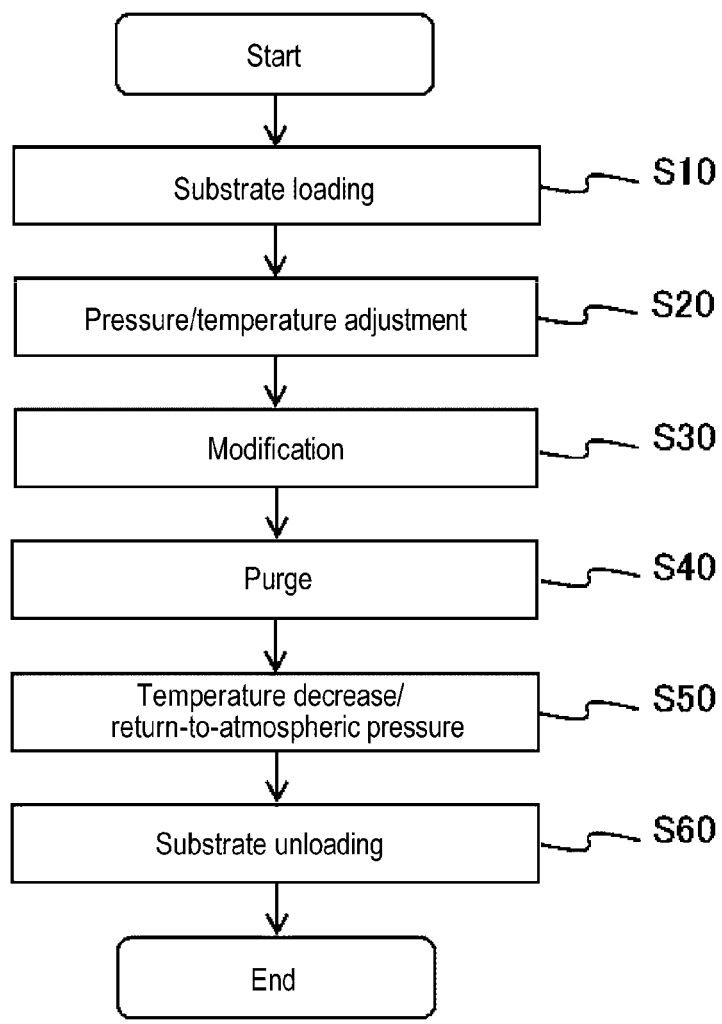
FIG. 8 is a flow chart showing a substrate processing procedure according to the first embodiment.

Hereinafter, a substrate processing procedure performed as one of procedures for manufacturing a semiconductor device according to the present embodiment is described with reference to FIG. 8. This procedure is performed by the above-described substrate processing apparatus. In the present embodiment, as an example of such a substrate processing procedure, a procedure (e.g., modification processing procedure) of using a vaporized gas, which is obtained by vaporizing hydrogen peroxide, as a process gas to modify (or oxidize) a silicon (Si)-containing film, which is formed on a wafer 200 as a substrate, into a silicon oxide film is described. In the following descriptions, the operation of various components of the substrate processing apparatus is controlled by the controller 121 illustrated in FIGS. 1 and 3.

Here, an example of using a substrate having an uneven structure, which is a micro structure, as a wafer 200, where at least a concave portion (i.e., groove) is filled with polysilazane ($SiH_2NH$) to form a silicon (Si)-containing film in the groove, and using a vaporized gas of hydrogen peroxide water as a process gas is described. The silicon-containing film contains silicon (Si), nitrogen (N), and hydrogen (H) and, in some cases, may further contain carbon (C) and other impurities. A substrate having a micro structure refers to a substrate having a structure with a high aspect ratio, such as a deep groove (i.e., concave portion) in the direction perpendicular to the substrate or a laterally narrow groove (i.e., concave portion) having a width from 10 nm to 50 nm.

Polysilazane is a substitute material for SOG which has been conventionally used. For example, polysilazane is obtained by catalytic reaction of ammonia with dichlorosilane or trichlorosilane, and is used to cover a substrate by using a spin coater so as to form a thin film. A thickness of the film is regulated depending on the molecular weight and viscosity of polysilazane and a rotation speed of the coater. A silicon oxide film can be formed by supplying water to the polysilazane.

(Substrate Load Step (S10))

Initially, a predetermined number of the wafers 200 is loaded onto the boat 217 (i.e., wafer charge). The boat 217 supporting the wafers 200 is lifted up by the boat elevator and is loaded into the reaction tube 203 (or the process chamber 201) (i.e., boat load). In this state, the seal cap 219 seals the furnace opening of the processing furnace 202.

(Pressure and Temperature Adjustment Step (S20))

An interior of the reaction tube 203 is vacuum-exhausted by at least one of the vacuum pumps 246a and 246b such that the internal pressure of the reaction tube 203 reaches a desired pressure (e.g., from 96,000 Pa to 102,500 Pa, specifically, about 100,000 Pa). In this operation, the internal pressure of the reaction tube 203 is measured by the pressure sensor 223 and a degree of opening of the APC valve 242 and opening or closing of the valve 240 is feedback-controlled based on the measured pressure (i.e., pressure adjustment).

The wafers 200 accommodated in the reaction tube 203 are heated by the first heating part 207 such that the temperature of the wafers 200 reaches a desired temperature (e.g., 40 degrees C. to 300 degrees C., specifically, about 150 degrees C.). In this operation, the supply of electric power to the first to fourth heater units 207a to 207d in the first heating part 207 is feedback-controlled based on temperature information detected by the first to fourth temperature sensors 263a to 263d such that the temperature of the wafers 200 in the reaction tube 203 reaches the desired temperature (i.e., temperature adjustment). Here, the first to fourth heater units 207a to 207d are controlled to have the same set temperature.

While the wafers 200 are heated, the boat rotation mechanism 267 is actuated to rotate the boat 217. A rotation speed of the boat 217 is controlled by the controller 121. The boat 217 is maintained to be rotated until at least the modification step (S30), which will be described later, ends.

Electric power is also supplied to the lamp heater 282, the inlet tube heater 285, and the exhaust tube heater 284 to adjust a temperature of the heaters to be in a range from 100 degrees C. to 300 degrees C. Specifically, the temperature of each of the lamp heater 282, the inlet tube heater 285, and the exhaust tube heater 284 may be adjusted to about 200 degrees C. The three heaters may be controlled to have different temperatures.

(Modification Step (S30))

When the wafers 200 are heated to reach the desired temperature and the boat 217 reaches the desired rotation speed, water vapor is generated by the water vapor generator 260 and is supplied into the process chamber 201. Nitrogen gas as an inert gas is also supplied from the inert gas supply source 240c into the process chamber 201. Thus, the internal pressure of the process chamber 201 is set to be in a range from 6,000 Pa to 60,000 Pa and the water vapor partial pressure in the process chamber 201 is set to be in a range from 600 Pa to 6,000 Pa (i.e., water concentration is set to be from 10% to 100%). Under the above conditions of the temperature and the pressure, the wafers 200 are subjected to heat treatment for 5 minutes to 120 minutes. Specifically, for example, under the conditions in which the internal temperature of the process chamber 201 is about 200 degrees C., the internal pressure of the process chamber 201 is 53,200 Pa, and a vapor partial pressure in the process chamber is 45,800 Pa (i.e., water concentration is 86%), the wafers 200 are subjected to heat treatment for 30 minutes. Due to the heat treatment under the water vapor atmosphere and the reduced-pressure as described above, a silicon-containing material coated on each of the wafers 200 is oxidized.

After a predetermined period of time elapses, the valves 242a and 242b are closed and the supply of the water vapor into the reaction tube 203 is stopped.

(Purge Step (S40))

After the modification step (S30) ends, the APC valve 255 is opened to vacuum-exhaust the interior of the reaction tube 203 so that remaining water vapor is discharged out of the reaction tube 203. Specifically, as the valves 242a and 242b are closed and the APC valve 255 is opened, $N_2$ gas (i.e., inert gas) as a purge gas is supplied from the inert gas supply pipe 232c into the reaction tube 203 via the gas supply nozzle 401 while a flow rate of the purge gas is controlled by the mass flow controller 241c, so as to exhaust the interior of the process chamber 201. Examples of the purge gas may include a rare gas such as He gas, Ne gas, Ar gas, and the like, in addition to the inert gas such as nitrogen ($N_2$) gas. As such, it is possible to facilitate purging of the remaining gas to be discharged out of the reaction tube 203.

(Temperature Decrease and Return-to-Atmospheric Pressure Step (S50))

After the purge step (S40) ends, the APC valve 255 or the vacuum pump 246a is adjusted to return the internal pressure of the reaction tube 203 to atmospheric pressure while the temperature of the wafers 200 is decreased to a predetermined temperature (e.g., room temperature or so). Specifically, while the valve 242c is opened, $N_2$ gas as an inert gas is supplied into the reaction tube 203 to increase the internal pressure of the reaction tube 203 to atmospheric pressure. Electric power supplied to the first heating part 207 and the liquefaction prevention heater 280 (i.e., second heating part) is controlled to decrease the temperature of the wafers 200.

When the temperature of the wafers 200 is decreased, the shutters 252, 254, and 256 may be opened, with a blower 257 actuated, to supply a cooling gas from a cooling gas supply pipe 249 into a space 262 between the reaction tube 203 and a heat insulating member 210 and exhaust the cooling gas via a cooling gas exhaust pipe 253, while a flow rate of the cooling gas is controlled by a mass flow controller 251. Examples of the cooling gas may include a rare gas (such as He gas, Ne gas, and Ar gas), air, or the like, alone or in combination, in addition to $N_2$ gas. Thus, the space 262 can be rapidly cooled so that the reaction tube 203 and the first heating part 207 installed in the space 262 can be cooled in a short time. In addition, the temperature of the wafers 200 in the reaction tube 203 can be decreased in a shorter time.

In addition, the cooling gas such as $N_2$ gas is supplied from the cooling gas supply pipe 249 into the space 262 such that the space 262 is filled and cooled with the cooling gas while the shutters 254 and 256 are closed, and the shutters 254 and 256 may then be opened, with the blower 257 actuated, to exhaust the cooling gas in the space 262 via the cooling gas exhaust pipe 253.

(Substrate Unload Step (S60))

The seal cap 219 is then descended by the boat elevator to open the bottom portion of the reaction tube 203 and, with the processed wafers 200 held on the boat 217, the wafers 200 are unloaded from the bottom portion of the reaction tube 203 out of the reaction tube 203 (or the process chamber 201) (i.e., boat unload). Subsequently, the processed wafers 200 are taken out of the boat 217 (i.e., wafer discharge) and the substrate processing procedure according to the present embodiment ends.

Figure 9:
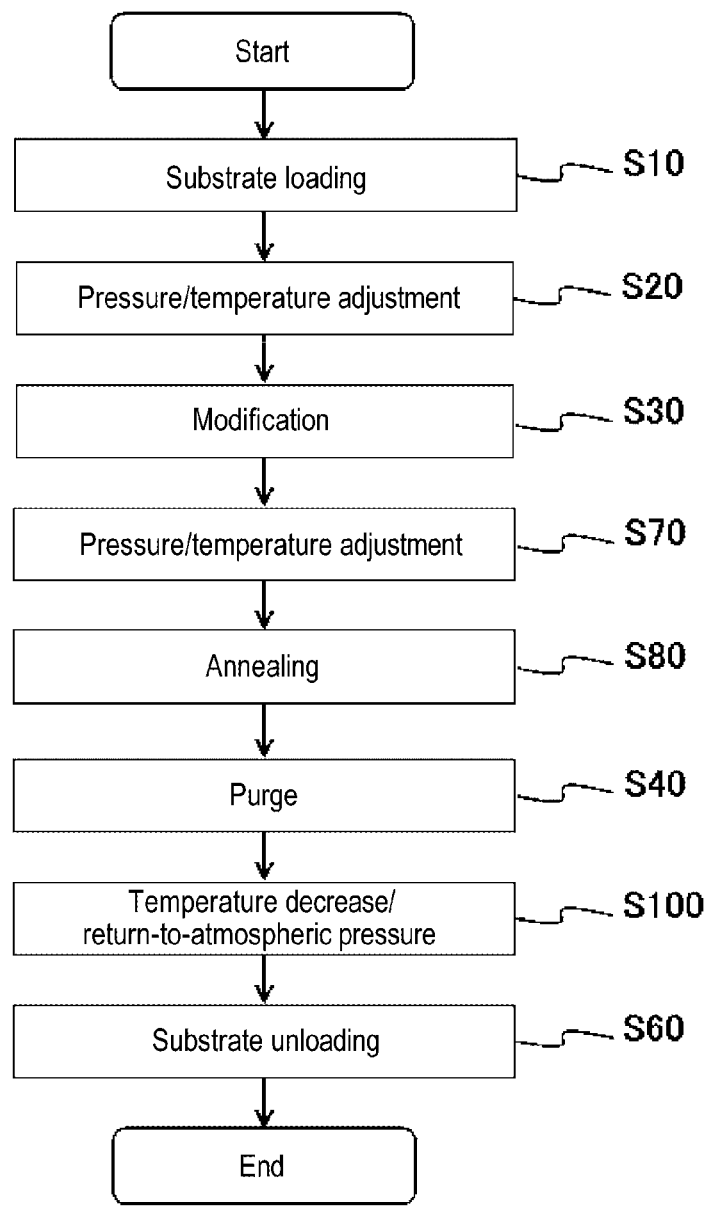
FIG. 9 is another flow chart showing a substrate processing procedure according to the first embodiment.

Although the water vapor herein is illustrated and described as being simply supplied to the silicon-containing film at a low temperature, the wafers 200 may be annealed subsequent to the modification step (S30), as illustrated in FIG. 9. The case of performing an annealing step (S80) is described below.

(Pressure and Temperature Adjustment Step (S70))

After the modification step (S30) ends, the internal temperature of the process chamber 201 is increased to be in a range from 600 degrees C. to 1,100 degrees C. In addition, water vapor is supplied from the water vapor generator 260 into the process chamber 201 and nitrogen gas as an inert gas is supplied from the inert gas supply source 240c into the process chamber 201. Thus, the internal pressure of the process chamber 201 is set to be in a range from 6,000 to 60,000 Pa and the water vapor partial pressure is set to be in a range from 600 to 60,000 Pa (i.e., water concentration is set to be from 10% to 100%). Specifically, in the present embodiment, the internal temperature of the process chamber 201 may be increased from the temperature in the modification step to 800 degrees C. for 120 minutes. In addition, since the temperature has started to increase in the pressure and temperature adjustment step (S70), the lamp heater 282, the inlet tube heater 285, and the exhaust heater 284 are turned off. In this operation, the heaters may be turned off at either the same timing or different timings. For example, because gas is flown into the gas supply pipe 233 and the gas exhaust pipe 231 during the annealing step, only the lamp heater 282 may be turned off, while the other heaters are turned on.

(Annealing Step (S80))

The wafers 200 are subjected to annealing for 5 minutes to 120 minutes under the above conditions of the temperature and the pressure. Specifically, in this embodiment, the wafers 200 may be subjected to annealing for 30 minutes under the conditions in which the temperature is about 800 degrees C., the pressure is 53,200 Pa, and the water vapor partial pressure is 45,800 Pa (i.e., water concentration is 86%).

(Purge Step (S40))

After the annealing step (S40) ends, the purge step S40 as described above is performed.

(Temperature Decrease and Return-to-Atmospheric Pressure Step (S100))

After the purge step ends, the temperature is decreased to reach a temperature at which the wafers can be extracted.

(Substrate Unload Step (S60))

The wafers 200 are unloaded from the process chamber 201 according to the substrate unload step as described above.

The substrate processing procedure according to the present embodiment has been described above. A cleaning step may be actually performed subsequent to the substrate unload step (S60) in the substrate processing procedure. This cleaning step can remove impurities remaining in the reaction tube 203, the boat 217, the inlet tube, and the exhaust tube, so as to prevent corrosion of members installed in the reaction tube 203.

(3) Effects of the First Embodiment

The first embodiment can achieve one or more effects as described below.

(a) According to the first embodiment, it is possible to prevent the vaporized precursor from being liquefied in the lower portion of the reaction tube 203.

(b) Also, it is possible to reduce an amount of alien substances attached to the substrates. In some cases where the vaporized precursor is liquefied, such liquid may absorb alien substances existing on surfaces of members in the process chamber 201 and may be again vaporized and attached to the wafers 200, resulting in generating different alien substances. According to the present embodiment, since the vaporized precursor can be prevented from being liquefied, the amount of alien substances attached to the substrates can be reduced.

(c) Additionally, it is possible to improve overall processing uniformity in the process chamber 201. Specifically, when a plurality of substrates is processed, difference in film thickness between the substrates can be reduced.

Figure 10:
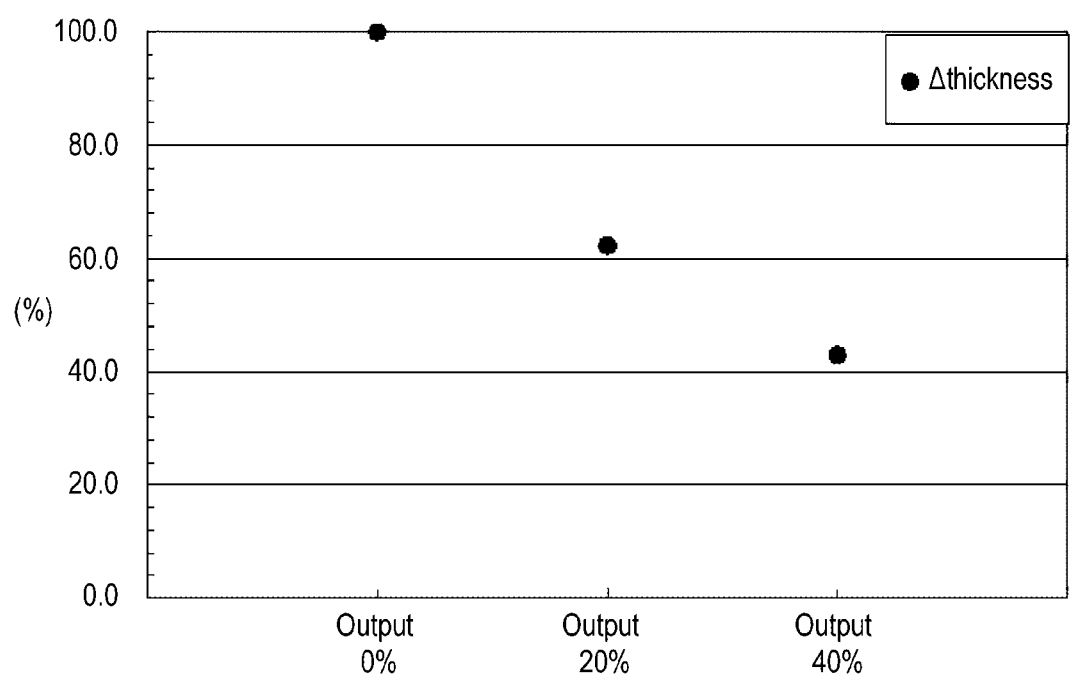
FIG. 10 illustrates examples of film thickness obtained from experiments conducted using the substrate processing apparatus according to the first to third embodiments.

FIG. 10 illustrates a relationship between difference in film thickness of substrates and electric power outputted to the lamp heater 282. As illustrated in FIG. 10, given that a film thickness difference when the lamp heater 282 is turned off is 100, when 20% and 40% of the output power are applied, it is indicated that the film thickness difference is reduced and overall processing uniformity in the process chamber 201 is improved.

(d) Further, nitrogen and hydrogen in polysilazane are substituted with oxygen by water molecules, so as to form a Si—O bonding.

(e) Furthermore, a silicon oxide film having a Si—O bonding, which does not contain much of NH— group, as a main skeleton can be formed as the silicon-containing film. Also, this silicon oxide film has heat resistance higher than that of a silicon oxide film made of conventional organic SOG.

(f) In addition, according to the low temperature processing, a groove in the micro structure can be uniformly processed, as compared to high temperature processing. With the high temperature processing, a top portion of the groove is first modified and a bottom portion of the groove may not be modified. However, the low temperature processing can prevent the top portion of the groove from being first modified when the processing starts, which allows the groove to be uniformly processed.

(g) In addition, the annealing process can remove impurities, such as nitrogen, hydrogen, and other impurities, in the silicon-containing film existing in the deepest portion in the groove on the wafers 200. As a result, the silicon-containing film can be sufficiently oxidized, densified, and cured, thereby achieving an insulating film having a good WER (Wafer Etching Rate) characteristic. WER has great dependency on final anneal temperature. That is, a higher anneal temperature provides a better WER characteristic.

(h) In addition, the annealing process can remove carbon (C) and impurities contained in the silicon-containing film. The silicon-containing film is typically formed by using a coating method such as a spin coating method or the like. The spin coating method uses liquid obtained by adding an organic solvent to polysilazane. However, carbon and other impurities (e.g., elements other than Si and O) derived from this organic solvent remain in the liquid.

(i) In addition, since the gas supply pipe 233 and the gas exhaust pipe 231 are installed in the same side, maintenance can be easily performed.

(j) Since a lamp emitting infrared rays is used for the lamp heater, water molecules can be efficiently heated. A wavelength of the infrared rays may be in a range, specifically, from about 0.7 μm to about 250 μm, more specifically, from about 1.3 μm to about 200 μm, still more specifically, from about 2 μm to about 20 μm, particularly specifically, from about 2 μm to about 4.5 μm.

(k) In addition, since the lamp heater can heat gas near the furnace opening, an inner wall surface of the furnace opening, an inner wall surface of the seal cap, and the like under a state where the seal of the furnace opening is cooled, it is possible to prevent dew condensation in the furnace opening.

In addition, if an atmosphere is close to a saturated vapor pressure or if a flow rate of gas is increased, dew condensation of the furnace opening tends to increase. However, the heating with the lamp heater can prevent dew condensation.

(l) Further, a time period for increasing a temperature of the furnace opening and the seal cap to a predetermined temperature can be reduced by heating the furnace opening and the seal cap with the lamp heater, which improves a manufacturing throughput of semiconductor devices. For example, as the furnace opening and the seal cap are cooled when the substrates are loaded into and unloaded from the process chamber, it is necessary to heat the cooled furnace opening and seal cap to a predetermined temperature until the process gas is supplied. Since the lamp heater can heat the furnace opening and the seal cap directly with radiative heat instead of conductive heat, the furnace opening and the seal cap can be quickly heated to the predetermined temperature.

Although the details of the first embodiment has been illustrated and described, the first embodiment is not limited to the features as set forth herein, but may be modified in different manners without departing from the gist of the present disclosure.

In addition, the inventors of the present disclosure have found, through careful research, that hydrogen peroxide can be used as a vaporized precursor gas to improve oxidation efficiency and oxidation quality of a silicon-containing film. This is described as a second embodiment below.

Second Embodiment

Figure 11:
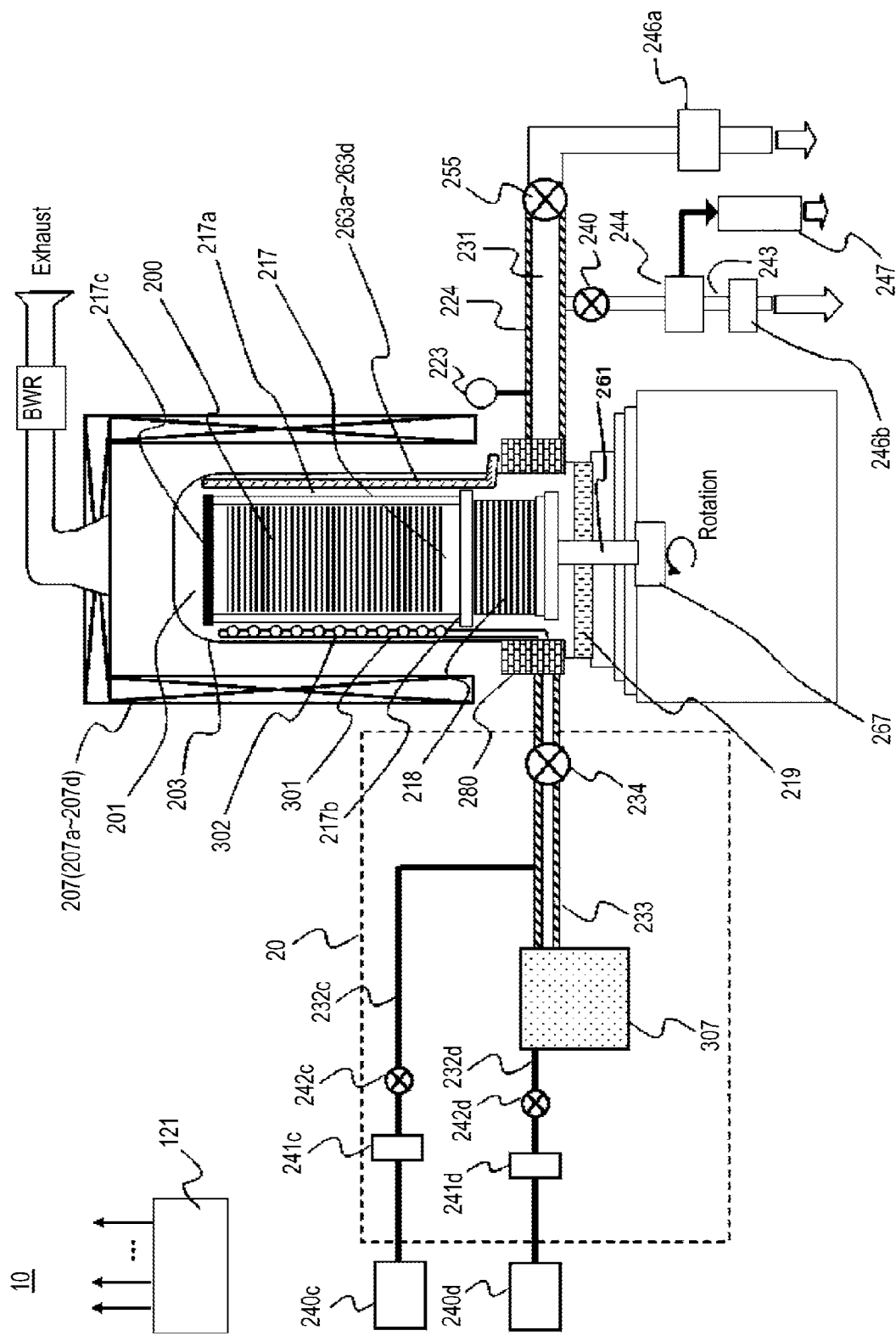
FIG. 11 schematically illustrates a substrate processing apparatus according to the second embodiment.
Figure 12:
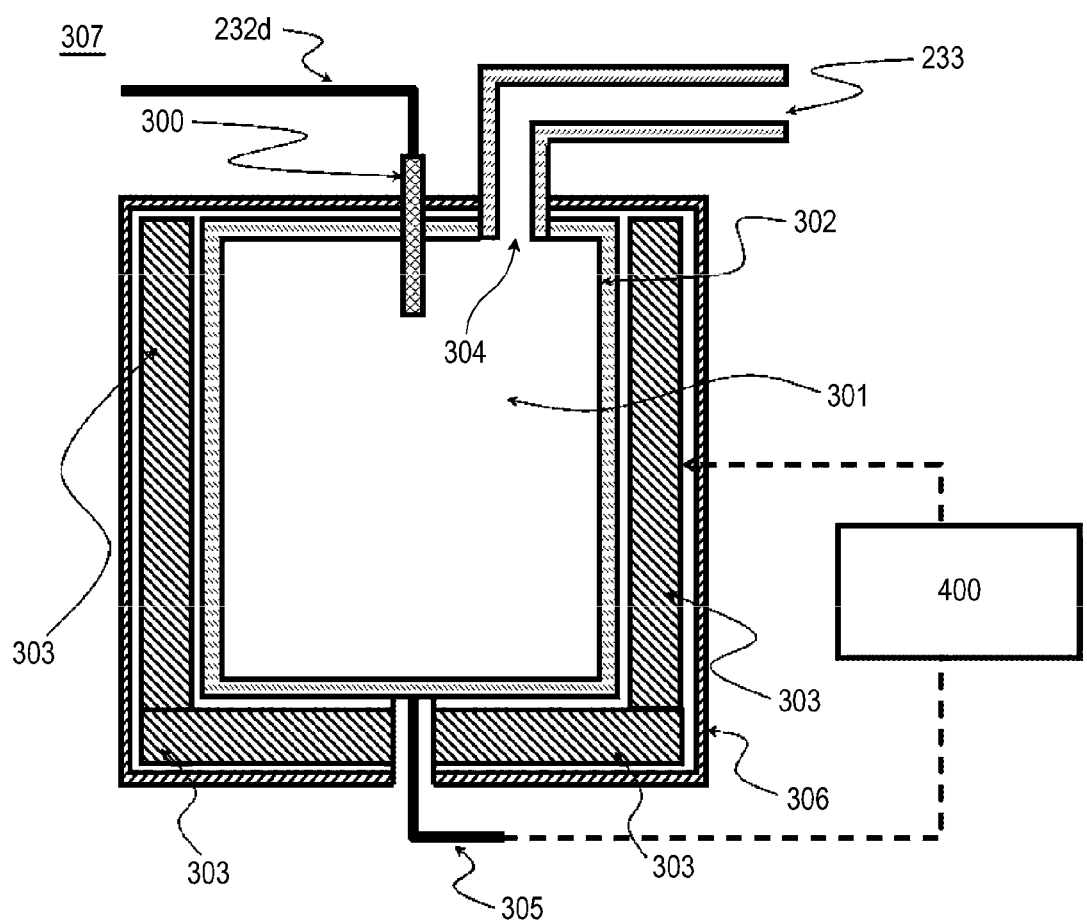
FIG. 12 schematically illustrates a configuration of a hydrogen peroxide vapor generator installed in the substrate processing apparatus according to the second embodiment.

Hereinafter, a second embodiment is described.
(1) Configuration of Substrate Processing Apparatus First, a configuration of a substrate processing apparatus according to the present embodiment is described with reference to FIGS. 11 and 12. FIG. 11 schematically illustrates the configuration of the substrate processing apparatus according to this embodiment, in which a portion of the processing furnace 202 is shown in a longitudinal sectional view. FIG. 12 illustrates a longitudinal sectional view of a hydrogen peroxide vaporization device according to the present embodiment.

In the substrate processing apparatus according to the second embodiment, a hydrogen peroxide supply unit is provided as the gas supply unit of the substrate processing apparatus according to the first embodiment. Other configurations have the same structures, and thus, explanations for such configurations are omitted.
(Gas Supply Unit)

As shown in FIG. 11, the hydrogen peroxide vapor generator 307 is connected to the gas supply pipe 233. The hydrogen peroxide vapor generator 307 is connected with a hydrogen peroxide water source 240d, a liquid mass flow controller 241d, and a valve 242d via a hydrogen peroxide solution supply pipe 232d from an upstream side. A hydrogen peroxide solution, whose flow rate is adjusted by the liquid mass flow controller 241d, can be supplied into the hydrogen peroxide vapor generator 307.

In addition, similar to the first embodiment, the gas supply pipe 233 is equipped with the inert gas supply pipe 232c, the valve 242c, the MFC 241c, and the inert gas supply source 240c for supplying an inert gas.

The gas supply unit includes the gas supply nozzle 401, the gas supply holes 402, the gas supply pipe 233, the hydrogen peroxide vapor generator 307, the hydrogen peroxide solution supply pipe 232d, the valve 242d, the liquid mass flow controller 241d, the inert gas supply pipe 232c, the valve 242c, and the MFC 241c. The hydrogen peroxide vapor supply unit may include the hydrogen peroxide water source 240d and the inert gas supply source 240c.

Additionally, in the second embodiment, since hydrogen peroxide is used, portions in the substrate processing apparatus, which are exposed to the hydrogen peroxide, may be made of material hard to react with hydrogen peroxide. Examples of the material hard to react with hydrogen peroxide may include ceramics, such as $Al_2O_3$, AlN, SiC, and the like, and quartz. In addition, metal members may be coated with a reaction prevention film. For example, alumite ($Al_2O_3$) may be used for an aluminum member, and a chromium oxide film may be used for a stainless member. Members which are not to be heated may be made of material such as Teflon®, plastics, or the like, which does not react with hydrogen peroxide.
(Hydrogen Peroxide Vapor Generator)

Figure 13:
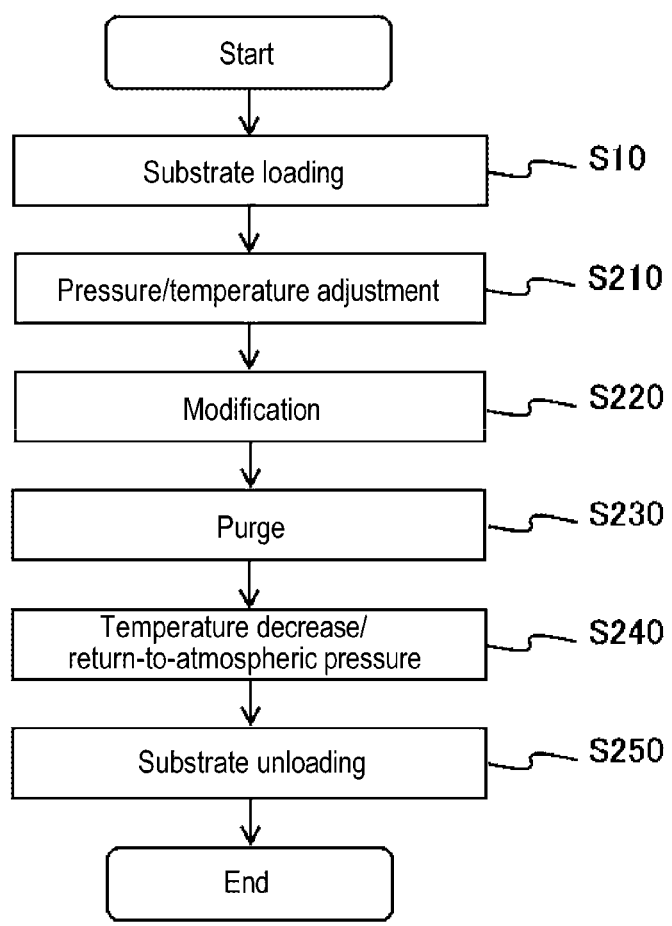
FIG. 13 is a flow chart showing a substrate processing procedure according to the second embodiment.

FIG. 12 illustrates a configuration of the hydrogen peroxide vapor generator 307. The hydrogen peroxide vapor generator 307 uses a dropping method, which vaporizes a precursor solution by dropping the precursor solution on a heated member. The hydrogen peroxide vapor generator 307 includes a dropping nozzle 300 serving as a liquid supply part for supplying a hydrogen peroxide solution, a vaporization container 302 serving as a member to be heated, a vaporization space 301 defined by the vaporization container 302, a vaporizer heater 303 serving as a heating part for heating the vaporization container 302, an exhaust port 304 for exhausting a vaporized precursor solution into the reaction chamber, a thermocouple 305 for measuring a temperature of the vaporization container 302, the temperature controller 400 for controlling the temperature of the vaporizer heater 303 based on the temperature measured by the thermocouple 305, and the hydrogen peroxide solution supply pipe 232d for supplying a precursor solution to the dropping nozzle 300. The vaporization container 302 is heated by the vaporizer heater 303 such that the dropped precursor solution is vaporized upon reaching the vaporization container. In addition, a heat insulating material 306 capable of heat-insulating the hydrogen peroxide vapor generator 307 from other units is further installed to improve heating efficiency of the vaporization container 302 by the vaporizer heater 303. The vaporization container 302 is made of quartz or silicon carbide in order to prevent a reaction with the precursor solution. The temperature of the vaporization container 302 is decreased due to a temperature or vaporization heat of the dropped precursor solution. Accordingly, to prevent such temperature decrease, it is effective to use silicon carbide, which has high thermal conductivity.
(2) Substrate Processing Procedure Hereinafter, a substrate processing procedure according to the second embodiment is described with reference to FIG. 13. The substrate load step (S10) in the substrate processing procedure according to the second embodiment, as shown in FIG. 13, has the same configuration as that of the first embodiment, and thus, explanation for the step is omitted.
(Pressure and Temperature Adjustment Step (S210))

An interior of the reaction tube 203 is vacuum-exhausted by at least one of the vacuum pumps 246a and 246b such that an internal pressure of the reaction tube 203 reaches a desired pressure (degree of vacuum). In this operation, the internal pressure of the reaction tube 203 is measured by the pressure sensor and a degree of opening of the APC valve 242 or opening or closing of the valve 240 is feedback-controlled based on the measured pressure (i.e., pressure adjustment).

The wafers 200 accommodated in the reaction tube 203 are heated by the first heating part 207 such that a temperature of the wafers 200 reaches a desired temperature (e.g., 40 degrees C. to 100 degrees C.). In this operation, the supply of electric power to the first to fourth heater units 207a to 207d in the first heating part 207 is feedback-controlled based on temperature information detected by the first to fourth temperature sensors 263a to 263d such that the temperature of the wafers 200 in the reaction tube 203 reaches the desired temperature (i.e., temperature adjustment). Here, the first to fourth heater units 207a to 207d are controlled to have the same set temperature.

While the wafers 200 are heated, the boat rotation mechanism 267 is actuated to rotate the boat 217. A rotation speed of the boat 217 is controlled by the controller 121. The boat 217 is maintained to be rotated until at least a modification step (S220), which will be described later, is ended.

Electric power is also supplied to the lamp heater 282, the inlet tube heater 285, and the exhaust tube heater 284 to adjust a temperature of the heaters to be in a range from 100 degrees C. to 300 degrees C. Specifically, the temperature of each of the lamp heater 282, the inlet tube heater 285, and the exhaust tube heater 284 is adjusted to about 200 degrees C. The three heaters may be controlled to have different temperatures.

(Modification Step (S220))

When the wafers 200 are heated and reach the desired temperature and the boat 217 reaches the desired rotation speed, hydrogen peroxide water begins to be supplied from the hydrogen peroxide solution supply pipe (i.e., liquid precursor supply pipe) 232d into the hydrogen peroxide vapor generator 307. Specifically, the valve 242d is opened, and the hydrogen peroxide is supplied from the hydrogen peroxide water source 240d into the hydrogen peroxide vapor generator 307 via the liquid mass flow controller 241d.

The hydrogen peroxide water supplied into the hydrogen peroxide vapor generator 307 is dropped from the dropping nozzle 300 onto a bottom portion of the vaporization container 302. As the vaporization container 302 is heated to a desired temperature (e.g., 150 degrees C. to 170 degrees C.) by the vaporizer heater 303, dropped droplets of the hydrogen peroxide are instantaneously heated and vaporized to become gas.

The hydrogen peroxide in a gas state is supplied onto the wafers 200 accommodated in the process chamber 201 via the gas supply pipe 233, the gas supply nozzle 401, and the gas supply holes 402.

When the vaporized gas of the hydrogen peroxide water causes an oxidation reaction with surfaces of the wafers 200, a silicon-containing film formed on each of the wafers 200 is modified into a SiO film.

When the hydrogen peroxide water is supplied into the reaction tube 203, the hydrogen peroxide water is exhausted via the vacuum pump 246b and a liquid collection tank 247. Specifically, the APC valve 255 is closed and the valve 240 is opened to pass an exhaust gas, which is exhausted from the reaction tube 203, from the gas exhaust pipe 231 through a separator 244 and a second exhaust pipe 243. Further, after separating the exhaust gas into a liquid that contains hydrogen peroxide and a gas that contains no hydrogen peroxide by using the separator 244, the gas is exhausted from the vacuum pump 246b and the liquid is collected in the liquid collection tank 247.

In addition, when the hydrogen peroxide water is supplied into the reaction tube 203, the valve 240 and the APC valve 255 may be closed to pressurize the interior of the reaction tube 203. This can make an atmosphere of the hydrogen peroxide water in the reaction tube 203 uniform.

After a predetermined period of time elapses, the valve 242d is closed and the supply of hydrogen peroxide into the reaction tube 203 is stopped.

Although the hydrogen peroxide water is described as being supplied into the hydrogen peroxide vapor generator and the hydrogen peroxide gas is described as being supplied into the process chamber 201, without being limited thereto, for example, a liquid that contains ozone ($O_3$), water ($H_2O$), or the like may be used.

(Purge Step (S230))

After the modification step (S220) ends, the APC valve 255 is closed and the valve 240 is opened to vacuum-exhaust the interior of the reaction tube 203 so that remaining vaporized gas of the hydrogen peroxide is discharged out of the reaction tube 203. Specifically, as the valve 242d is closed and the valve 242c is opened, $N_2$ gas (i.e., inert gas) as a purge gas is supplied from the inert gas supply pipe 232c into the reaction tube 203 via the liquid precursor supply nozzle 230 while a flow rate of the purge gas is controlled by the mass flow controller 241c. Examples of the purge gas may include a rare gas such as He gas, Ne gas, Ar gas, and the like, in addition to the inert gas such as the nitrogen ($N_2$) gas. As such, it is possible to purge the remaining gas to be discharged out of the reaction tube 203. In addition, when the $N_2$ gas passes through the gas supply nozzle 401, the hydrogen peroxide gas remaining in the gas supply nozzle 401 can be extruded and removed. In this operation, the degree of opening of the APC valve 255 and closing or opening of the valve may be adjusted to exhaust the remaining hydrogen peroxide from the vacuum pump 246a.

(Temperature Decrease and Return-to-Atmospheric Pressure Step (S240))

After the purge step (S230) ends, at least one of the valve 240 and the APC valve 255 is opened to decrease the temperature of the wafers 200 to a predetermined temperature (e.g., room temperature or so) while the internal pressure of the reaction tube 203 returns to atmospheric pressure. Specifically, while a valve 242c is opened, $N_2$ gas as an inert gas is supplied into the reaction tube to increase the internal pressure of the reaction tube 203 to atmospheric pressure. Electric power supplied to the first heating part 207 is controlled to decrease the temperature of the wafers 200.

While the temperature of the wafers 200 is decreased, the shutters 252, 254, and 256 may be opened, with the blower 257 actuated, to supply a cooling gas from the cooling gas supply pipe 249 into the space 262 between the reaction tube 203 and the heat insulating member 210 and exhaust the cooling gas via the cooling gas exhaust pipe 253, while a flow rate of the cooling gas is controlled by the mass flow controller 251. Examples of the cooling gas may include a rare gas (such as He gas, Ne gas, and Ar gas), air, or the like, alone or in combination, in addition to $N_2$ gas. Thus, the space 262 can be rapidly cooled so that the reaction tube 203 and the first heating part 207 installed in the space 262 can be cooled in a short time. In addition, the temperature of the wafers 200 in the reaction tube 203 can be decreased in a shorter time.

In addition, the cooling gas such as $N_2$ gas is supplied from the cooling gas supply pipe 249 into the space 262 such that the space 262 is filled and cooled with the cooling gas while the shutters 254 and 256 are closed, and the shutters 254 and 256 may then be opened, with the blower 257 actuated, to exhaust the cooling gas in the space 262 via the cooling gas exhaust pipe 253.

When the temperature is decreased sufficiently, the supply of the electric power to the lamp heater 282, the inlet tube heater 285, and the exhaust tube heater 284 is stopped. The supply of the electric power to the heaters may be stopped at either the same timing or different timings.

(Substrate Unload Step (S230))

The seal cap 219 is then descended by the boat elevator to open the bottom portion of the reaction tube 203 and, with the processed wafers 200 held on the boat 217, the wafers 200 are unloaded from the bottom portion of the reaction tube 203 out of the reaction tube 203 (or the process chamber 201) (i.e., boat unload). Subsequently, the processed wafers 200 are taken out of the boat 217 (i.e., wafer discharge) and the substrate processing procedure according to the present embodiment ends.

(3) Effects of the Second Embodiment

The second embodiment can achieve one or more effects as described below, in addition to the effects of the first embodiment.

(a) Since the vaporized gas of the hydrogen peroxide water, which has higher activation energy and more oxygen atoms in one molecule (hence, stronger oxidation power) than water vapor ($H_2O$) is used as the process gas, it can deliver oxygen atoms (O) to a deep portion of a film formed in a groove of each of the wafers 200 (i.e., a bottom portion of the groove). Thus, a degree of modification between a surface and a deep portion of a film on each wafer 200 can be more uniform. As such, since more uniform substrate processing can be performed between the surface and the deep portion of the film formed on the wafer 200, a uniform dielectric constant of the modified wafer 200 can be achieved. In addition, since the modification step can be performed at a low temperature in a range from 40 degrees C. to 100 degrees C., performance of a circuit formed on the wafer 200 can be prevented from being deteriorated.

(b) Also, since the hydrogen peroxide has a stronger oxidation power than water vapor ($H_2O$), processing time can be shortened.

(c) Additionally, it is possible to prevent the hydrogen peroxide vapor from being re-liquefied in the reaction tube 203 and around the inlet tube and the exhaust tube.

Although the details the second embodiment has been illustrated and described, the second embodiment is not limited to the features set forth herein, but may be modified in different manners without departing from the gist of the present disclosure.

In addition, the inventors of the present disclosure have found, through careful research, that vaporizing hydrogen peroxide in the process chamber 201 can prevent the hydrogen peroxide from being liquefied. This is described as a third embodiment below.

Third Embodiment

Hereinafter, a third embodiment will be described below.

(1) Configuration of Substrate Processing Apparatus

Figure 14:
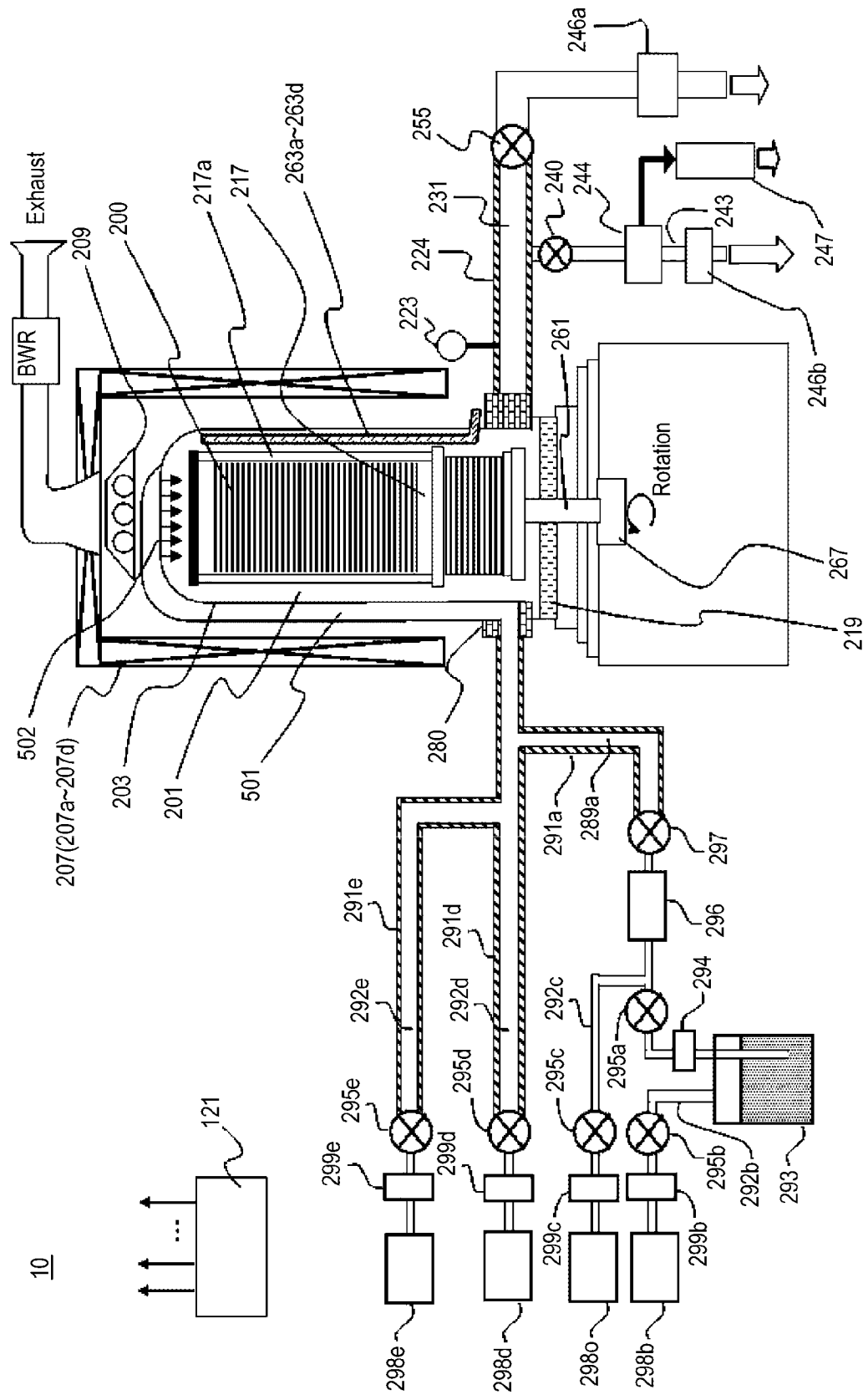
FIG. 14 schematically illustrates a substrate processing apparatus according to the third embodiment.
Figure 15:
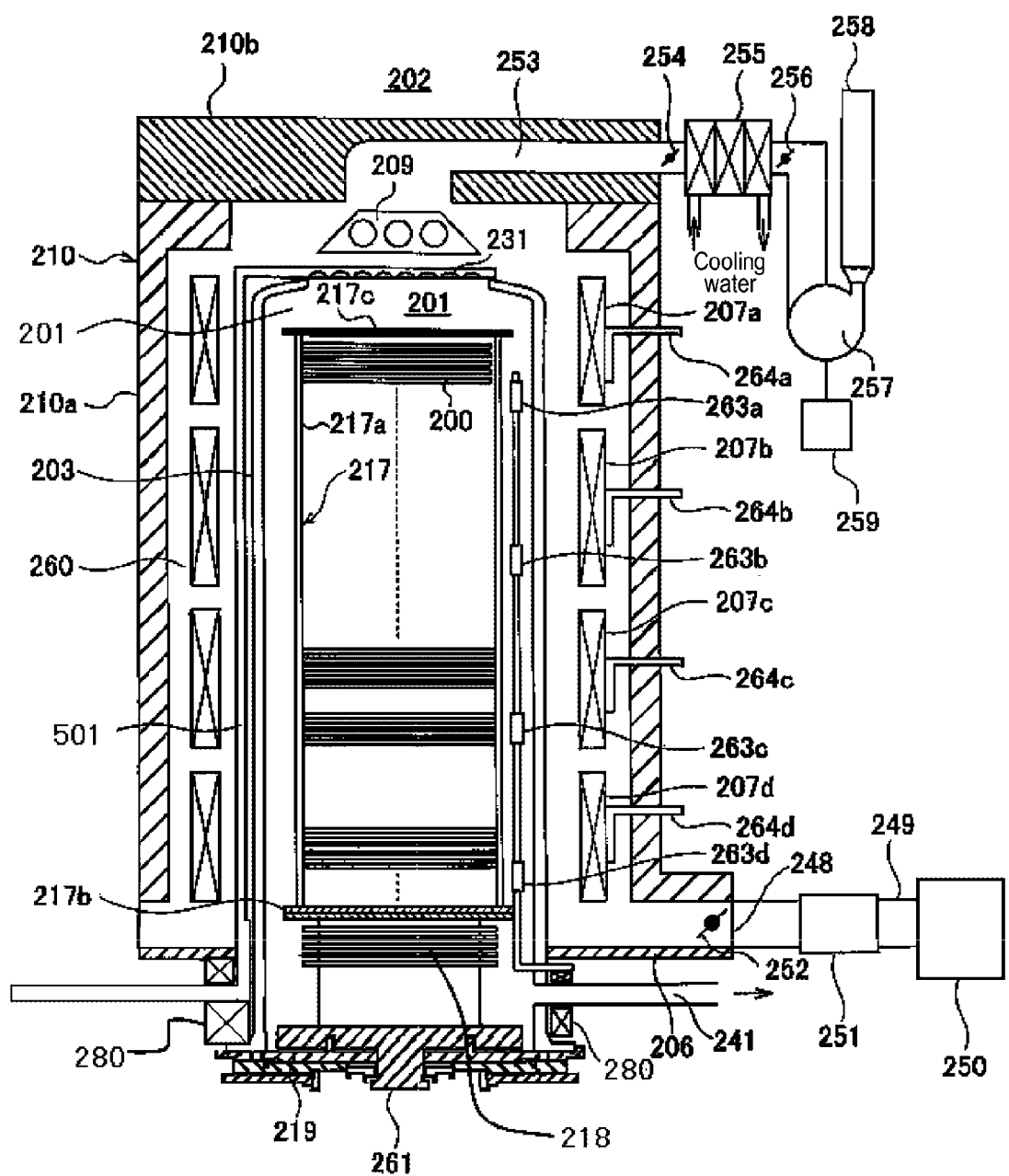
FIG. 15 schematically illustrates a longitudinal sectional view of the substrate processing apparatus according to the third embodiment.

First, a configuration of a substrate processing apparatus according to the third embodiment will be described with reference to FIGS. 14 and 15. FIG. 14 schematically illustrates the configuration of the substrate processing apparatus according to the third embodiment, in which a portion of the processing furnace 202 is shown in a longitudinal sectional view. FIG. 15 schematically illustrates a longitudinal sectional view of the processing furnace 202 in the substrate processing apparatus according to the third embodiment.

(Gas Supply Unit)

As shown in FIG. 14, a liquid precursor supply nozzle 501 is installed between the reaction tube 203 and the first heating part 207. The liquid precursor supply nozzle 501 is made of, for example, quartz having low thermal conductivity. The liquid precursor supply nozzle 501 may have a dual-tube structure. The liquid precursor supply nozzle 501 is disposed along an outer wall of the reaction tube 203. An upper end portion (i.e., downstream end portion) of the liquid precursor supply nozzle 501 is air-tightly installed at the top portion (i.e., upper end opening) of the reaction tube 203. A plurality of supply holes 502 is formed in the liquid precursor supply nozzle 501 located in the upper end opening of the reaction tube 203 from an upstream side to an downstream side (see FIG. 15). The supply holes 502 are formed to cause a liquid precursor, which is to be supplied into the reaction tube 203, to be jetted toward the ceiling plate 217c of the boat 217 accommodated in the reaction tube 203.

A downstream end portion of a liquid precursor supply pipe 289a for supplying the liquid precursor is connected to an upstream end portion of the liquid precursor supply nozzle 501. A liquid precursor supply tank 293, a liquid mass flow controller (LMFC) 294 as a liquid flow rate controller (i.e., liquid flow rate control unit), an opening/closing valve 295a, a separator 296, and an opening/closing valve 297 are sequentially installed in the liquid precursor supply pipe 289a from an upstream side. In addition, a sub-heater 291a is installed in the liquid precursor supply pipe 289a, at a more downstream side than at least the valve 297.

A downstream end portion of a pumping gas supply pipe 292b for supplying a pumping gas is connected to a top portion of the liquid precursor supply tank 293. A pumping gas supply source 298b, a mass flow controller (MFC) 299b as a flow rate controller (i.e., flow rate control unit), and an opening/closing valve 295b are sequentially installed in the pumping gas supply pipe 292b from an upstream side.

A third heating part 209 is installed in an outer upper portion of the reaction tube 203. The third heating part 209 is configured to heat the ceiling plate 217c of the boat 217. An example of the third heating part 209 may include a lamp heater unit or the like. The controller 121 is electrically connected to the third heating part 209. The controller 121 is configured to control the supply of electric power to the third heating part 209 at a predetermined timing such that the ceiling plate 217c of the boat 217 reaches a predetermined temperature.

An inert gas supply pipe 292c is connected between the valve 295a and the separator 296 of the liquid precursor supply pipe 289a. An inert gas supply source 298c, a mass flow controller (MFC) 299c serving as a flow rate controller (i.e., flow rate control unit), and an opening/closing valve 295c are sequentially installed to the inert gas supply pipe 292c from an upstream side.

A downstream end portion of a first gas supply pipe 292d is connected at a more downstream side than the valve 297 of the liquid precursor supply pipe 289a. A precursor gas supply source 298d, a mass flow controller (MFC) 299d serving as a flow rate controller (i.e., flow rate control unit), and an opening/closing valve 295d are sequentially installed in the first gas supply pipe 292d from an upstream side. A sub-heater 291d is installed at a more downstream side than at least the valve 295d of the first gas supply pipe 292d. A downstream end portion of a second gas supply pipe 292e is connected at a more downstream side than the valve 295d of the first gas supply pipe 292d. A precursor gas supply source 298e, a mass flow controller (MFC) 299e serving as a flow rate controller (i.e., flow rate control unit), and an opening/closing valve 295e are sequentially installed in the second gas supply pipe 292e from an upstream side. A sub-heater 291e is installed in the second gas supply pipe 292e, at a more downstream side than at least the valve 295e.

Hereinafter, an operation of generating a process gas (or vaporized gas) by vaporizing a liquid precursor is described. Initially, a pumping gas is supplied from the pumping gas supply pipe 292b into the liquid precursor supply tank 293 via the mass flow controller 299b and the valve 295b. Thus, the liquid precursor stored in the liquid precursor supply tank 293 is supplied into the liquid precursor supply pipe 289a. The liquid precursor, which has been supplied from the liquid precursor supply tank 293 into the liquid precursor supply pipe 289a, is supplied into the reaction tube 203 via the liquid mass flow controller 294, the valve 295a, the separator 296, the valve 297, and the liquid precursor supply nozzle 501. The liquid precursor supplied into the reaction tube 203 is then vaporized by contacting with the ceiling plate 217c, which is heated by the third heating part 209, to generate the process gas (i.e., vaporized gas). This process gas is supplied onto the wafers 200 in the reaction tube 203 and predetermined substrate processing is performed on the wafers 200.

In addition, in order to facilitate the vaporization of the liquid precursor, the liquid precursor flowing into the liquid precursor supply pipe 289a may be preliminarily heated by the sub-heater 291a. Thus, it is possible to supply the liquid precursor, which can be easily vaporized, into the reaction tube 203.

A liquid precursor supply system mainly includes the liquid precursor supply pipe 289a, the liquid mass flow controller 294, the valve 295a, the separator 296, the valve 297, and the liquid precursor supply nozzle 501. The liquid precursor supply system may include the liquid precursor supply tank 293, the pumping gas supply pipe 292b, the pumping gas supply source 298b, the mass flow controller 299b, and the valve 295b. A gas supply unit mainly includes the liquid precursor supply system, the third heating part 209, and the ceiling plate 217c.

An inert gas supply system mainly includes the inert gas supply pipe 292c, the mass flow controller 299c, and the valve 295c. The inert gas supply system may include the inert gas supply source 298c, the liquid precursor supply pipe 289a, the separator 296, the valve 297, and the liquid precursor supply nozzle 501. A first process gas supply system mainly includes the first gas supply pipe 292d, the mass flow controller 299d, and the valve 295d. The first process gas supply system may include the precursor gas supply source 298d, the liquid precursor supply pipe 289a, the liquid precursor supply nozzle 501, the third heating part 209, and the ceiling plate 217c. A second process gas supply system mainly includes the second gas supply pipe 292e, the mass flow controller 299e, and the valve 295e. The second process gas supply system may include the precursor gas supply source 298e, the liquid precursor supply pipe 289a, the first gas supply pipe 292d, the liquid precursor supply nozzle 501, the third heating part 209, and the ceiling plate 217c. Although that the ceiling plate 217c is described as being installed in the boat 217, the ceiling plate 217c may be installed in an upper portion of the reaction tube 203, instead of the boat 217.

Other configurations are the same as those in the first and second embodiments and therefore, explanations for such configurations are omitted.

(2) Substrate Processing Procedure

Figure 16:
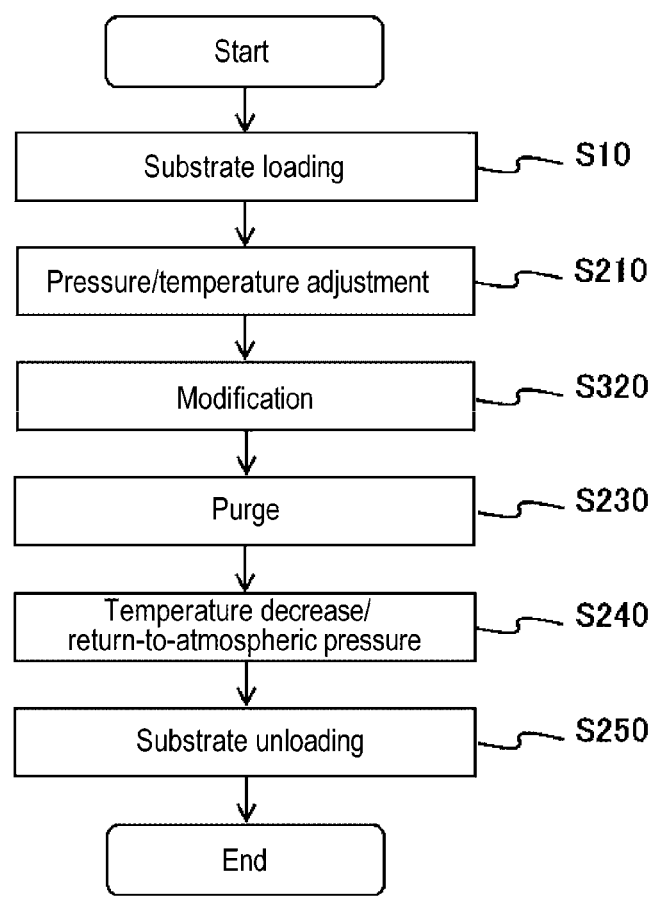
FIG. 16 is a flow chart showing a substrate processing procedure according to the third embodiment.

Hereinafter, a substrate processing procedure performed as one of procedures for manufacturing a semiconductor device according to the present embodiment is described with reference to FIG. 16. Steps except for a modification step (S320) have the same configurations as those of the first and second embodiments, and thus, explanations for such steps are omitted.

(Modification Step (S320))

When the wafers 200 are heated and reach a desired temperature and the boat 217 reaches a desired rotation speed, hydrogen peroxide as the liquid precursor begins to be supplied from the liquid precursor supply pipe 289a into the reaction tube 203. Specifically, the valves 295c, 295d, and 295e are closed and the valve 295b is opened to supply a pumping gas from the pumping gas supply source 298b into the liquid precursor supply tank 293, while a flow rate of the pumping gas is controlled by the mass flow controller 299b. In addition, the valve 295a and the valve 297 are opened to supply hydrogen peroxide water stored in the liquid precursor supply tank 293 from the liquid precursor supply pipe 289a into the reaction tube 203 via the separator 296 and the liquid precursor supply nozzle 501, while a flow rate of the hydrogen peroxide water is controlled by the liquid mass flow controller 294. Examples of the pumping gas may include inert gases such as nitrogen ($N_2$) gas and the like, and rare gases such as He gas, Ne gas, Ar gas and the like.

The hydrogen peroxide water supplied into the reaction tube 203 is vaporized by contacting with the ceiling plate 217c of the boat 217, which is heated by the third heating part 209, to generate a vaporized gas of the hydrogen peroxide water as a process gas. In this manner, the vaporized gas of the hydrogen peroxide water as the process gas may be generated in the reaction tube 203. As such, the hydrogen peroxide water as the liquid precursor has only to be passed through the liquid precursor supply nozzle 501. The third heating part 209 is preset to a temperature at which the ceiling plate 217c can be heated to a temperature (e.g., 150 degrees C. to 170 degrees C.) which vaporize the hydrogen peroxide water.

The vaporized gas of the hydrogen peroxide water is supplied onto the wafers 200 and causes an oxidation reaction with surfaces of the wafers 200, to modify a silicon-containing film formed on each wafer 200 into a SiO film.

While the hydrogen peroxide water is supplied into the reaction tube 203, the hydrogen peroxide water is exhausted via the vacuum pump 246b and the liquid collection tank 247. Specifically, the APC valve 242 is closed and the valve 240 is opened to pass an exhaust gas, which is exhausted from the reaction tube 203, from the gas exhaust pipe 231 through the separator 244 and the second exhaust pipe 243. Further, after separating the exhaust gas into a liquid containing hydrogen peroxide and a gas containing no hydrogen peroxide by means of the separator 244, the gas is exhausted from the vacuum pump 246b and the liquid is collected in the liquid collection tank 247.

In addition, when the hydrogen peroxide water is supplied into the reaction tube 203, the valve 240 and the APC valve 255 may be closed to pressurize the interior of the reaction tube 203. This can make an atmosphere of the hydrogen peroxide water in the reaction tube 203 uniform.

After a predetermined period of time elapses, the valves 295a, 295b, and 297 are closed the supply of the hydrogen peroxide water into the reaction tube 203 is stopped.

The present disclosure is not limited to using the vaporized gas of the hydrogen peroxide water as the process gas and, for example, a gas containing a hydrogen element (H) (i.e., hydrogen-containing gas), such as hydrogen ($H_2$) gas, and a gas containing an oxygen element (O) (i.e., oxygen-containing gas), such as an oxygen ($O_2$) gas, may be heated to generate a water vapor ($H_2O$) gas to be used in the present disclosure. Specifically, the valves 295a, 295b, and 297 may be closed and the valves 295d and 295e are opened to supply $H_2$ gas and $O_2$ gas from the first gas supply pipe 292d and the second gas supply pipe 292e, respectively, into the reaction tube 203, while flow rates of the gases are controlled, respectively, by the mass flow controllers 299d and 299e. Water vapor may then be generated as the $H_2$ gas and the $O_2$ gas supplied into the reaction tube 203 make contact with the ceiling plate 217c of the boat 217, which is heated by the third heating part 209, and supplied onto the wafers 200, such that a silicon-containing film formed on each wafer is modified into a SiO film. Examples of the oxygen-containing gas may include ozone ($O_3$) gas, water vapor ($H_2O$), and the like, in addition to $O_2$ gas.

(3) Effects of the Third Embodiment

The third embodiment can achieve one or more effects as described below, in addition to the effects of the first and second embodiments.

(a) Since vaporization occurs in the process chamber 201, no dew condensation occurs in the gas supply unit, which leads to reducing alien substances occurring on the wafers 200.

(b) In addition, since a distance from a gas source to an exhaust unit is shortened, liquefaction in the exhaust unit can be prevented, which leads to reducing alien substances on the wafers 200, which may occur because of a backflow of gas that is re-liquefied or re-vaporized in the exhaust unit.

Although the details of the third embodiment has been illustrated and described, the third embodiment is not limited to the features set forth herein, but may be modified in different manners without departing from the gist of the present disclosure.

In addition, although water ($H_2O$) is described as being used as a vaporization precursor, gas supplied onto the wafers 200 may include a state of $H_2O$ molecular elements or a state of clusters where several molecules are combined. In addition, when the gas is generated from liquid, the gas may be divided to be in a state of $H_2O$ molecular elements or a state of hydrogen (H) atoms and oxygen (O) atoms, or may be separated to be in a state of clusters where several molecules are combined. In addition, the gas may be in a state of mist where the above clusters congregate.

Similarly, when hydrogen peroxide ($H_2O_2$) is used as a vaporization precursor, gas supplied onto the wafers 200 may also include a state of $H_2O$ molecular elements or a state of clusters where several molecules are combined. In addition, when the gas is generated from liquid, the gas may be divided to be in a state of $H_2O_2$ molecular elements or a state of clusters where several molecules are combined. In addition, the gas may be in a state of mist where the above clusters congregate.

Further, although the procedure which is a procedure of manufacturing a semiconductor device, where wafers 200 are processed and, and also is a procedure of filling a fine groove with an insulator is described in the above, the present disclosure according to the first to third embodiments may be applied to procedures other than the above-described procedure. For example, the present disclosure may be applied to a procedure of forming an interlayer insulating film of a semiconductor device substrate, a procedure of sealing a semiconductor device, and the like.

Furthermore, although the procedure of manufacturing a semiconductor device is described in the above, the present disclosure according to the first to third embodiments may be applied to procedures other than the above-described procedure. For example, the present disclosure may be applied to a sealing process for a liquid crystal substrate in a liquid crystal device manufacturing procedure, a water-repellent coating process for a glass substrate or a ceramic substrate used for various kinds of devices, a water-repellent coating process for mirrors, and the like.

Additionally, although the process gas is described as water vapor ($H_2O$), which is generated from oxygen gas and hydrogen gas or is generated by heating and vaporizing water ($H_2O$) or hydrogen peroxide ($H_2O_2$) water as an oxidant solution, in the above, the present disclosure is not limited to the above, but may employ a method of providing mist by applying an ultrasonic wave to water ($H_2O$) or hydrogen peroxide ($H_2O_2$) water, a method of spaying mist by an atomizer. Further, a method of vaporizing a solution by directly and instantaneously irradiating the solution with a laser ray or a microwave may be employed.

In addition, although the thermal conductor heating part is described as a lamp heater in the above, the heating part is not limited thereto, but may be a radiative heating part that emits a laser ray or a microwave.

Also, although an example of processing the wafers 200 on which a polysilazane film is formed is described in the above, the present disclosure is not limited thereto, but may be applied to the case of processing a silicon-containing film formed by a CVD method.

<Aspects of Present Disclosure>

Hereinafter, the some aspects of the present disclosure are additionally described.

<Supplementary Note 1>

According to an aspect of the present disclosure, there is provided a substrate processing apparatus including a reaction tube in which a substrate is processed; a gas supply unit configured to supply supplies a process gas to the substrate in the reaction tube; an exhaust unit configured to exhaust an interior of the reaction tube; a first heating unit configured to heat the substrate in the reaction tube; a second heating unit is installed around a connection portion of the exhaust unit and the reaction tube; and a control unit configured to control a temperature of the second heating unit when the process gas is supplied from the gas supply unit.

<Supplementary Note 2>

In the substrate processing apparatus of Supplementary Note 1, the temperature of the second heating unit may be controlled to be maintained at a liquefaction prevention temperature at which the process gas is not liquefied.

<Supplementary Note 3>

In the substrate processing apparatus of Supplementary Note 2, the liquefaction prevention temperature may be in a range from 50 degrees C. to 300 degrees C.

<Supplementary Note 4>

In the substrate processing apparatus of any one of Supplementary Notes 1 to 3, the process gas may contain hydrogen and oxygen.

<Supplementary Note 5>

In the substrate processing apparatus of any one of Supplementary Notes 1 to 4, the process gas may contain water molecules.

<Supplementary Note 6>
In the substrate processing apparatus of any one of Supplementary Notes 1 to 5, the second heating unit may be installed around a furnace opening of the reaction tube.
<Supplementary Note 7>
In the substrate processing apparatus of any one of Supplementary Notes 1 to 6, a heat insulator may be installed in the furnace opening of the reaction tube and the second heating unit may be installed below a top portion of the heat insulator.
<Supplementary Note 8>
In the substrate processing apparatus of any one of Supplementary Notes 1 to 7, the second heating unit may be a radiative heating unit.
<Supplementary Note 9>
In the substrate processing apparatus of Supplementary Note 1 to 8, the radiative heating unit may heat an inner wall surface of the furnace opening.
<Supplementary Note 10>
In the substrate processing apparatus of any one of Supplementary Notes 1 to 9, the second heating unit may emit light having a peak wavelength in a range from 0.7 μm to 250 μm.
<Supplementary Note 11>
In the substrate processing apparatus of any one of Supplementary Notes 1 to 10, the second heating unit may emit light having a peak wavelength in a range from 1.3 μm to 200 μm.
<Supplementary Note 12>
In the substrate processing apparatus of any one of Supplementary Notes 1 to 11, the second heating unit may emit light having a peak wavelength in a range from 2 μm to 20 μm.
<Supplementary Note 13>
In the substrate processing apparatus of any one of Supplementary Notes 1 to 12, the second heating unit may emit light having a peak wavelength in a range from 2 μm to 4.5 μm.
<Supplementary Note 14>
In the substrate processing apparatus of any one of Supplementary Notes 1 to 13, the second heating unit may be a lamp heater emitting an infrared ray.
<Supplementary Note 15>
In the substrate processing apparatus of any one of Supplementary Notes 1 to 14, the second heating unit may be installed around a portion of the reaction tube to which the exhaust unit is connected.
<Supplementary Note 16>
In the substrate processing apparatus of any one of Supplementary Notes 1 to 15, the second heating unit may be installed in a divided manner around a portion of the reaction tube to which the exhaust unit is connected.
<Supplementary Note 17>
The substrate processing apparatus of any one of Supplementary Notes 1 to 16 may further include a thermal conductive member such as thermal conductive ceramic or nonmetallic material coated with thermal conductive ceramic in the reaction tube.
<Supplementary Note 18>
In the substrate processing apparatus of Supplementary Note 17, the thermal conductive member may be installed on a bottom portion of the reaction tube.
<Supplementary Note 19>
In the substrate processing apparatus of Supplementary Note 17 or 18, thermal conductivity of the thermal conductive member may be 5 W/mK.

<Supplementary Note 20>
In the substrate processing apparatus of any one of Supplementary Notes 1 to 19, an inlet tube heater may be installed in a gas supply port of the reaction tube around the second heating unit.
<Supplementary Note 21>
In the substrate processing apparatus of any one of Supplementary Notes 1 to 20, an exhaust tube heater may be installed in a gas exhaust port of the reaction tube around the second heating unit.
<Supplementary Note 22>
In the substrate processing apparatus of Supplementary Note 20 or 21, the liquefaction prevention temperatures of the second heating unit, the inlet tube heater, and the exhaust tube heater may be controlled independently or collectively.
<Supplementary Note 23>
In the substrate processing apparatus of Supplementary Note 22, the second heating unit, the inlet tube heater, and the exhaust tube heater may be turned on at least while the gas supply unit supplies the process gas.
<Supplementary Note 24>
According to another aspect of the present disclosure, there is provided a semiconductor device manufacturing apparatus including a reaction tube in which a substrate is processed; a gas supply unit configured to supply a process gas to the substrate in the reaction tube; an exhaust unit configured to exhaust an interior of the reaction tube; a first heating unit configured to heat the substrate in the reaction tube; a second heating unit installed around a connection portion of the exhaust unit and the reaction tube; and a control unit configured to control a temperature of the second heating unit when the process gas is supplied from the gas supply unit.
<Supplementary Note 25>
According to another aspect of the present disclosure, there is provided a substrate processing method including loading a substrate into a reaction tube; heating the substrate by a first heating unit installed in the reaction tube; exhausting an interior of the reaction tube by an exhaust unit; and supplying a gas, wherein the act of supplying the gas includes supplying the process gas to a surface of the substrate; and controlling a temperature of a second heating unit installed around a connection portion of the exhaust unit and the reaction tube.
<Supplementary Note 26>
In the substrate processing method of Supplementary Note 25, the temperature of the second heating unit may be controlled to be maintained at a liquefaction prevention temperature at which the process gas is not liquefied.
<Supplementary Note 27>
In the substrate processing method of Supplementary Note 25, the process gas may include one or both of water ($H_2O$) molecules and hydrogen peroxide ($H_2O_2$) molecules.
<Supplementary Note 28>
According to another aspect of the present disclosure, there is provided a semiconductor device manufacturing method including loading a substrate into a reaction tube; heating the substrate by a first heating unit installed in the reaction tube; exhausting an interior of the reaction tube by an exhaust unit; and supplying a gas, wherein the act of supplying the gas includes supplying the process gas to a surface of the substrate; and controlling the temperature of a second heating unit installed around a connection portion of the exhaust unit and the reaction tube.
<Supplementary Note 29>
According to another aspect of the present disclosure, there is provided a program that causes a computer to perform a process of heating a substrate by a first heating unit installed in a reaction tube; exhausting an interior of the reaction tube by an exhaust unit; and supplying a gas, wherein the act of supplying the gas includes supplying a process gas to a surface of the substrate; and controlling a temperature of a second heating unit installed around a connection portion of the exhaust unit and the reaction tube.

<Supplementary Note 30>

According to another aspect of the present disclosure, there is provided a non-transitory computer-readable recording medium storing a program that causes a computer to perform a process of heating a substrate by a first heating unit installed in a reaction tube; exhausting an interior of the reaction tube by an exhaust unit; and supplying a gas, wherein the act of supplying the gas includes supplying a process gas to a surface of the substrate; and controlling a temperature of a second heating unit installed around a connection portion of the exhaust unit and the reaction tube.

<Supplementary Note 31>

According to another aspect of the present disclosure, there is provided a heating unit which is installed at an exhaust port side of a reaction tube accommodating a substrate, and heats the exhaust port side at a temperature higher than a temperature of the substrate.

<Supplementary Note 32>

According to another aspect of the present disclosure, there is provided a substrate processing apparatus including a reaction tube configured to accommodate a substrate; a gas supply unit configured to supply a process gas to the substrate in the reaction tube; an exhaust unit configured to exhaust an interior of the reaction tube; a first heating unit configured to heat the substrate; a second heating unit installed around a connection portion of the exhaust unit and the reaction tube; and a control unit configured to control a temperature of the second heating unit to a temperature higher than a temperature of the first heating unit when the process gas is supplied from the gas supply unit.

<Supplementary Note 33>

According to another aspect of the present disclosure, there is provided a substrate processing apparatus including a process chamber configured to accommodates a substrate; a gas supply unit configured to supply a process gas to the substrate; a lid member configured to block the process chamber; a thermal conductor installed on the lid member; and a thermal conductor heating unit configured to heat the thermal conductor.

<Supplementary Note 34>

The substrate processing apparatus of Supplementary Note 33 may further include a control unit configured to control the thermal conductor heating unit such that a temperature of the thermal conductor heating unit is maintained at a liquefaction prevention temperature at which the process gas is not liquefied.

<Supplementary Note 35>

In substrate processing apparatus of Supplementary Note 33, the thermal conductor heating unit may be installed around a furnace opening of the process chamber.

<Supplementary Note 36>

In substrate processing apparatus of Supplementary Note 33, the thermal conductor heating unit may be installed below a top portion of a heat insulator installed in a furnace opening of the process container.

<Supplementary Note 37>

In substrate processing apparatus of Supplementary Note 33, the thermal conductor heating unit may be a radiative heating unit.

<Supplementary Note 38>

According to another aspect of the present disclosure, there is provided a thermal conductor which is installed in a lid member configured to block a process chamber accommodating a substrate and, is configured to be heated by a thermal conductor heating unit installed near the lid member.

According to the substrate processing apparatus of the present disclosure, it is possible to improve manufacturing quality and throughput of semiconductor devices.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a process chamber configured to accommodate a plurality of substrates;
a substrate holding unit configured to hold the plurality of substrates accommodated in the process chamber;
a gas supply unit configured to supply a process gas into the process chamber;
a lid member configured to block an end portion opening of the process chamber;
a substrate heating unit configured to heat the plurality of substrates held by the substrate holding unit;
a heat insulator installed between the substrate holding unit and an end portion of the process chamber;
a lamp heater installed around a side wall of the end portion of the process chamber and surrounding a circumference of the process chamber, wherein the lamp heater is installed below a top portion of the heat insulator;
an O-ring installed between the lid member and the end portion of the process chamber;
a cooling passage installed around the end portion of the process chamber and surrounding the circumference of the process chamber, and installed below the lamp heater and above the O-ring;
a thermal conductor, without a self-heating function, installed on a surface of the lid member exposed within an inner space of the process chamber below the heat insulator such that the surface of the lid member is covered with the thermal conductor, the thermal conductor having a annular shape covering an area of the surface of the lid member along an inner circumference of the process chamber and made of a material having higher thermal conductivity than that of the lid member and configured to be heated directly with light radiated by the lamp heater; and
a control unit configured to control the lamp heater to heat the thermal conductor while the process gas is being supplied to the plurality of substrates from the gas supply unit.

2. The substrate processing apparatus of claim 1, wherein the lamp heater is configured to heat the thermal conductor via the end portion of the process chamber consisting of a transparent member through which light transmits.

3. The substrate processing apparatus of claim 1, wherein the control unit is configured to control the lamp heater such that a temperature of the lamp heater is maintained at a liquefaction prevention temperature at which the process gas is not liquefied.

4. The substrate processing apparatus of claim 3, wherein the liquefaction prevention temperature is in a range from 50 degrees C. to 300 degrees C.

5. The substrate processing apparatus of claim 1, wherein the thermal conductor includes thermal conductive ceramic or nonmetallic material coated with thermal conductive ceramic.

6. The substrate processing apparatus of claim 1, wherein thermal conductivity of the thermal conductor is between 5 W/mK and 200 W/mK.

7. The substrate processing apparatus of claim 1, wherein the thermal conductor has a porous structure.

8. The substrate processing apparatus of claim 1, wherein the process gas is water vapor or a vaporized gas of hydrogen peroxide water.

9. A method of manufacturing a semiconductor device comprising:
   providing a substrate processing apparatus that includes:
      a process chamber configured to accommodate a plurality of substrates;
      a substrate holding unit configured to hold the plurality of substrates accommodated in the process chamber;
      a gas supply unit configured to supply a process gas into the process chamber;
      a lid member configured to block an end portion opening of the process chamber;
      a substrate heating unit configured to heat the plurality of substrates held by the substrate holding unit;
      a heat insulator installed between the substrate holding unit and an end portion of the process chamber;
      a lamp heater installed around a side wall of the end portion of the process chamber and surrounding a circumference of the process chamber, wherein the lamp heater is installed below a top portion of the heat insulator;
      an O-ring installed between the lid member and the end portion of the process chamber;
      a cooling passage installed around the end portion of the process chamber and surrounding the circumference of the process chamber, and installed below the lamp heater and above the O-ring; and
      a thermal conductor, without a self-heating function, installed on a surface of the lid member exposed within an inner space of the process chamber below the heat insulator such that the surface of the lid member is covered with the thermal conductor, the thermal conductor having a annular shape covering an area of the surface of the lid member along an inner circumference of the process chamber and made of a material having higher thermal conductivity than that of the lid member and configured to be heated directly with light radiated by the lamp heater; and
   heating the thermal conductor directly with light radiated by the lamp heater surrounding the circumference of the process chamber while the process gas is supplied to the substrate.

10. The method of claim 9, wherein the act of heating the thermal conductor by the lamp heater comprises controlling the lamp heater such that a temperature of the lamp heater is maintained at a liquefaction prevention temperature at which the process gas is not liquefied.

* * * * *